(12) United States Patent
Agarwal et al.

(10) Patent No.: US 10,015,607 B2
(45) Date of Patent: *Jul. 3, 2018

(54) TEMPERATURE COMPENSATION FOR LOAD IDENTIFICATION

(71) Applicant: Cirrus Logic International Semiconductor Ltd., Edinburgh (GB)

(72) Inventors: Shatam Agarwal, Austin, TX (US); Alvin Chuck Storvik, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 50 days.

This patent is subject to a terminal disclaimer.

(21) Appl. No.: 15/191,981

(22) Filed: Jun. 24, 2016

(65) Prior Publication Data
US 2017/0245073 A1    Aug. 24, 2017

Related U.S. Application Data

(63) Continuation-in-part of application No. 15/099,356, filed on Apr. 14, 2016, now Pat. No. 9,800,984.
(Continued)

(51) Int. Cl.
*H04R 29/00* (2006.01)
*H04R 3/00* (2006.01)
(Continued)

(52) U.S. Cl.
CPC .......... *H04R 29/001* (2013.01); *H03F 3/183* (2013.01); *H03M 1/12* (2013.01); *H03M 1/66* (2013.01); *H04R 3/00* (2013.01)

(58) Field of Classification Search
CPC .......... H03F 3/183; H03M 1/12; H03M 1/66; H04R 3/00; H04R 29/001
(Continued)

(56) References Cited

U.S. PATENT DOCUMENTS

| 6,278,390 B1 * | 8/2001 | Meyer | H03M 1/1076 341/118 |
| 6,940,440 B1 * | 9/2005 | Iacob | H03M 1/002 341/144 |

(Continued)

FOREIGN PATENT DOCUMENTS

| EP | 2905974 A1 | 8/2015 |
| WO | 198703378 A1 | 6/1987 |

(Continued)

OTHER PUBLICATIONS

Brennan, Sean "Measuring a Loudspeaker Impedance Profile Using the AD5933" Application Note Analog Devices, No. AN-843, Jun. 2007 (Jun. 2007), pp. 1-12.

*Primary Examiner* — Hemant Patel
(74) *Attorney, Agent, or Firm* — Norton Rose Fulbright US LLP

(57) ABSTRACT

An electronic device may be configured to identify a load coupled to the device. The device may measure direct current (DC) and/or alternating current (AC) impedances of the load to identify the load. The device may then take action based on the identification of the load. For example, a specific transducer may be identified as coupled to the electronic device and an appropriate equalization curve applied to an audio output of the device. The measurement of load impedance may include controlling a reference generator according to a search algorithm to identify the load, including compensating the measured impedance for temperature changes. An analog-to-digital converter (ADC) may operate through the search algorithm to provide feedback to digital circuitry regarding how to proceed through the search algorithm to identify the load.

19 Claims, 18 Drawing Sheets

Related U.S. Application Data which is a continuation-in-part of application No. 15/050,139, filed on Feb. 22, 2016.

(51) Int. Cl.
*H03M 1/12* (2006.01)
*H03M 1/66* (2006.01)
*H03F 3/183* (2006.01)

(58) Field of Classification Search
USPC .......................................................... 381/58
See application file for complete search history.

(56) References Cited

U.S. PATENT DOCUMENTS

| | | | |
|---|---|---|---|
| 7,349,546 B2 * | 3/2008 | Ganton | H04R 5/04 |
| | | | 379/430 |
| 7,808,324 B1 | 10/2010 | Woodford et al. | |
| 2004/0122541 A1 | 6/2004 | DiSanza et al. | |
| 2008/0155134 A1 | 6/2008 | Mulligan et al. | |
| 2009/0087725 A1 * | 4/2009 | Sim | G01R 1/203 |
| | | | 429/90 |
| 2014/0003616 A1 | 1/2014 | Johnson et al. | |
| 2014/0010381 A1 | 1/2014 | Day | |
| 2015/0231398 A1 | 8/2015 | Marnfeldt et al. | |
| 2017/0245072 A1 * | 8/2017 | Agarwal | H04R 29/001 |

FOREIGN PATENT DOCUMENTS

| | | |
|---|---|---|
| WO | 2009010056 A1 | 1/2009 |
| WO | 2009/134537 A2 | 11/2009 |
| WO | 2015039002 A2 | 3/2015 |

* cited by examiner

TEMPERATURE COMPENSATION FOR LOAD IDENTIFICATION

CROSS-REFERENCE TO RELATED PATENT APPLICATIONS

This application is a continuation-in-part of U.S. patent application Ser. No. 15/099,356 to Agarwal et al., filed Apr. 14, 2016, and entitled "Identification Of A Load With A Search Algorithm That Controls Application Of Signals To The Load And A Reference Generator," which is a continuation-in-part of U.S. patent application Ser. No. 15/050,139 to Agarwal et al., filed Feb. 22, 2016, and entitled "Direct Current (DC) and/or Alternating Current (AC) Load Detection for Audio Codec," each of which is hereby incorporated by reference. This application is also related to the subject matter disclosed in U.S. patent application Ser. No. 15/099,340, filed Apr. 14, 2016, and entitled "Alternating Current (AC) Load Identification Technique Using a Search Algorithm."

FIELD OF THE DISCLOSURE

The instant disclosure relates to load measurements. More specifically, portions of this disclosure relate to detecting characteristics of a load attached to an audio output using direct current (DC) and/or alternating current (AC)-based techniques.

BACKGROUND

Portable audio devices have become extremely popular devices in recent years. Their popularity has soared, in part, as a result of a reduction in electric component power consumption, which makes long battery life possible, and a reduction in cost of digital data storage, which makes carrying large collections of music in a pocket-sized device possible. Further, mobile phones and tablets function as portable audio devices, and mobile phone and tablet ownership has significantly increased as a result in declining prices of smartphones and tablets, and increased availability of 4G technology that allows streaming and downloading of audio files to the smartphones and tablets. Although audio quality from portable audio devices has increased over the time of growth of the portable audio device market, audio quality has generally not been a primary differentiator between devices. However, as other technological improvements, such as storage density and power consumption, are coming at a slower rate, consumers are beginning to evaluate devices based on audio quality. Further, professional and semi-professional musicians and technicians are making more use of portable audio devices in their businesses, which also demand high audio quality.

One popular manner of consuming audio from a portable audio device is headphones. Headphones vary in cost, such as from a few dollars to a few thousand dollars, and the quality of the headphones span a similarly wide divide. The varying characteristics of headphones on the market can cause a portable audio device to sound significantly different depending on what headphones are plugged into the device. Conventional portable audio devices, such as a smartphone 102 of FIG. 1, detect when a set of headphones is attached. The device uses this indication to determine when to turn off the loudspeaker. However, conventional portable audio devices generally have no other information about what is plugged into the headphone jack. For example, one set of headphones 104A may have a DC load impedance of 12 ohms, whereas another set of headphones 104B may have a DC load impedance of 50 ohms. The DC load impedance, one characteristic of the headphones 104A and 104B, can affect the sound quality and sound intensity generated by the smartphone 102. However, because the smartphone 102 has no information about such characteristics, the smartphone 102 is unable to compensate for the difference between headphones 104A and 104B.

Shortcomings mentioned here are only representative and are included simply to highlight that a need exists for improved electrical components, particularly for audio devices employed in consumer-level devices, such as mobile phones. Embodiments described herein address certain shortcomings but not necessarily each and every one described here or known in the art.

SUMMARY

A load may be identified by measuring characteristics of the load in response to signals applied to the load. The response of the load to the applied signal may be determined by applying second signals to a reference load to generate a reference value. The reference value may be compared to the response of the load and compared to determine how the load compares with the reference load. In some embodiments, rather than generating a reference signal from a reference load, a reference signal may be directly generated in accordance with the second signals.

An electronic device may be configured to identify a load coupled to the device. The device may measure direct current (DC) and/or alternating current (AC) characteristics of the load to identify the load. The device may then take action based on the identification of the load. For example, a specific transducer may be identified as coupled to the electronic device and an appropriate equalization curve applied to an audio output of the device. The measurement of characteristics of the load may include controlling a reference generator according to a search algorithm, such as a step ramp or binary search, to identify the load. An analog-to-digital converter (ADC) may operate through the search algorithm to provide feedback to digital circuitry regarding how to proceed through the search algorithm to identify the load.

In some embodiments, a search algorithm may be executed to control one or both of the applied signal to the load or the generation of the reference signal. In one example, the generation of the reference signal may be controlled to generate a series of reference signals. The response of the load may be compared to each of the reference signals. The series of comparisons may be used to identify the load or determine characteristics of the load. The values in the series of reference signals may be controlled by a search algorithm. In a step ramp search, the value of the reference signals may be increased or decreased following certain increments or decrements until a certain condition is met. In a binary search, the value of the reference signals may follow a process of dividing intervals in half until a certain condition is met. Although step ramp and binary searches are described herein, other search algorithms may be implemented with embodiments of the invention disclosed herein. The condition for terminating the search algorithm may be based on whether the load has been identified or the load's identity sufficiently narrowed down. The condition for terminating the search algorithm may also be based on whether a certain characteristic of the load, such as resistance of the load, is known to within a certain threshold error tolerance.

According to one embodiment of the invention, an apparatus may include a first output node configured to couple to a load; a first digital-to-analog converter (DAC) coupled to the first output node; sense circuitry coupled to the first output node; a reference generator; a second digital-to-analog converter (DAC) coupled to the reference generator; an analog-to-digital converter (ADC) coupled to the sense circuitry and coupled to the reference generator; and digital circuitry coupled to the first digital-to-analog converter (DAC) and coupled to the second digital-to-analog converter (DAC) and coupled to the analog-to-digital converter (ADC) and configured to control at least one of the first digital-to-analog converter (DAC) and the second digital-to-analog converter (DAC) to identify the load, such as by determining an impedance of the load at DC and/or a frequency response of the load. In some embodiments, the first output node may be a headphone port of a mobile device and the load being identified may be a set of headphones coupled to the headphone port.

In some embodiments, the digital circuitry may receive feedback from the analog-to-digital converter (ADC) for selecting a new first and/or second signal for application to the first and/or second digital-to-analog converters (DACs). The feedback may be used to adjust the first and/or second signals as part of a search algorithm. In certain embodiments, the digital circuitry may be configured to operate the first digital-to-analog (DAC) to generate a direct current (DC) signal at the first output node, wherein the analog-to-digital converter (ADC) is configured to generate an output digital signal based, at least in part, on a sensed value measured by the sense circuitry; to operate the second digital-to-analog (DAC) to generate a reference input, wherein the analog-to-digital converter (ADC) is configured to generate the output digital signal based, at least in part, on the reference input; to monitor an output of the analog-to-digital converter (ADC) to determine a DC impedance of the load; to operate the first digital-to-analog (DAC) to generate an alternating current (AC) signal at the first output node, wherein the analog-to-digital converter (ADC) is configured to generate an output digital signal based, at least in part, on a sensed value measured by the sense circuitry; to operate the second digital-to-analog (DAC) to generate a reference input, wherein the analog-to-digital converter (ADC) is configured to generate the output digital signal based, at least in part, on the reference input; and/or to monitor an output of the comparator to determine an AC frequency response of the load.

According to another embodiment, an apparatus may include digital circuitry configured to determine at least one characteristic of a load, such as to be able to uniquely identify the load. The digital circuitry may be configured to perform steps including applying a first signal to a load; determining a characteristic of the load based on the applied first signal; applying a second signal to a reference generator; determining a characteristic of the reference generator in response to the applied second signal; comparing the determined characteristics of the load and of the reference generator; and/or identifying the load based on the compared characteristics of the load and of the reference generator. In some embodiments, the digital circuitry may be further configured to adjust at least one of the first signal and the second signal based on the comparing of the determined characteristics of the load and of the reference generator. The identification of the load may then be based on the results of the adjustment of the first signal and/or the second signal. For example, the resulting second signal value that causes the search algorithm to terminate may provide information regarding a characteristic of the load.

According to a further embodiment, a method may include applying a first signal to a load; determining a characteristic of the load based on the applied first signal; applying a second signal to a reference generator; determining a characteristic of the reference generator in response to the applied second signal; comparing the determined characteristics of the load and of the reference generator; and/or identifying the load based on the compared characteristics of the load and of the reference generator.

In some embodiments, load identification may be used to identify a speaker or headphone coupled to an electronic device by using digital-to-analog converters (DACs), such as current-mode DACs. A portable audio device, such as a smartphone, may be configured to measure load characteristics of headphones, or another speaker or transducer, attached to an audio output. The device may measure direct current (DC) and/or alternating current (AC) characteristics of the load. These characteristics may be measured by an audio component, such as an audio coder/decoder (codec) chip or integrated circuit (IC) controller, and reported to software or firmware executing on a processor coupled to the audio component. The software or firmware may then take action based on the measured load characteristics. For example, the load characteristics may be compared to a database of headphones and their known load characteristics to determine or identify a particular headphone model or type of headphone attached to the audio output. The processor may then perform modifications to the audio output to adjust for the headphone's particular load characteristics. For example, a certain headphone may be known to have poor frequency response in a particular frequency range, and the processor may compensate by applying an equalization scheme that boosts sound levels in that frequency range. Although certain functionality is described as performed by an audio component or a processor, the functionality may be present in either the audio component or the processor or another component of the portable audio device. For example, the audio component may include a database of known headphones and report the brand of the attached headphone to the processor, rather than report load characteristics.

According to one embodiment, an apparatus may include a first output node configured to couple to a load; a first digital-to-analog converter (DAC) coupled to the first output node; sense circuitry coupled to the first output node; a reference generator; a second digital-to-analog converter (DAC) coupled to the reference generator; an analog-to-digital converter (ADC) coupled to the sense circuitry and coupled to the reference generator; and/or a controller coupled to the analog-to-digital converter (ADC) and to the first digital-to-analog converter (DAC) and to the second digital-to-analog converter (DAC) and configured to control the reference generator to determine an impedance of the load. The controller may be configured to perform steps including applying a periodic signal to the load; controlling the reference generator through a control signal to the second digital-to-analog converter (DAC) to generate a reference value; comparing a sensed value received from the sense circuitry with the reference value, wherein the sense circuitry determines a response of the load to the applied periodic signal; and/or searching for a generated control signal that produces a reference value approximately equal to the sensed value.

In certain embodiments, the step of searching for the generated control signal that produces the reference value approximately equal to the sensed value may include the steps of receiving a comparator trip indicator signal when the reference value crosses the sensed value and/or receiving a termination indicator signal when the reference value is within a specified threshold around the sensed value; the step of searching for the generated control signal that produces the reference value approximately equal to the sensed value may include the step of adjusting the control signal based, at least in part, on a search algorithm, wherein the search algorithm adjusts the control signal based on the comparator trip indicator signal and the termination indicator signal; the specified threshold may be based, at least in part, on a desired accuracy for a determined impedance of the load that is based on the reference value when the termination indicator signal is received; the load may be a transducer for reproducing audio, and the controller may identify the transducer based, at least in part, on the determined impedance of the load; and/or the step of searching for a generated control signal may be repeated for two or more different periodic signals, wherein a plurality of generated control signals that produce reference values approximately equal to the sensed value at each of the different periodic signals may include a frequency response of the load, and wherein the controller is further configured to identify the load based on the frequency response According to another embodiment, a method for characterizing a load may include applying a periodic signal to a load; controlling a reference generator through a control signal to generate a reference value; comparing a value sensed from the load in response to the applied periodic signal with the reference value generated by the reference generator; and/or searching for a generated control signal that produces a reference value approximately equal to the sensed value.

According to a further embodiment, an apparatus may include digital circuitry configured to determine at least one characteristic of a load by performing steps including applying a periodic signal to a load; controlling a reference generator through a control signal to generate a reference value; comparing a value sensed from the load in response to the applied periodic signal with the reference value generated by the reference generator; and/or searching for a generated control signal that produces a reference value approximately equal to the sensed value.

According to one embodiment, an apparatus may include a first output node configured to couple to a load and output a first portion of a differential signal; a second output node configured to couple to the load and output a second portion of a differential signal; a first digital-to-analog converter (DAC) coupled to the first output node through a first switch; a second digital-to-analog converter (DAC) coupled to the second output node through a second switch; a reference node coupled to the second digital-to-analog converter (DAC) and coupled to a reference resistance, wherein the reference node may be set at a reference voltage by driving a reference current through the second digital-to-analog converter (DAC) and through the reference resistance; and/or a comparator coupled to the first output node and coupled to the reference node.

In certain embodiments, the load is a transducer for reproducing audio, and wherein the controller is configured to identify the transducer based, at least in part, on the determined DC impedance of the load; the load may be a transducer for reproducing audio, and wherein the controller is configured to identify the transducer based, at least in part, on the determined DC impedance of the load and the determined AC frequency response of the load; and/or the load may be a transducer for reproducing audio, and wherein the controller is configured to identify the transducer based, at least in part, on the determined AC frequency response of the load.

In certain embodiments, the apparatus may also include a controller; the controller may be configured to operate the first digital-to-analog (DAC) and to operate the second digital-to-analog (DAC) to generate a direct current (DC) signal at the first output node and the reference node, respectively, and/or to monitor an output of the comparator to determine a DC impedance of the load; the controller may be configured to operate the second digital-to-analog (DAC) to perform a step ramp of the reference voltage at the reference node; the controller may be configured to operate the second digital-to-analog (DAC) to perform a binary search for a reference current and corresponding reference voltage at which a voltage across the load is approximately equal to the reference voltage; the controller may be configured: to operate the first digital-to-analog (DAC) and to operate the second digital-to-analog (DAC) to generate an alternating current (AC) signal at the first output node and the reference node, respectively, and/or to monitor an output of the comparator to determine an AC frequency response of the load; the controller may be configured to operate the first digital-to-analog (DAC) to generate an alternating current (AC) signal at the first output node, to operate the second digital-to-analog (DAC) to generate a direct current (DC) signal at the reference node, and/or to monitor an output of the comparator to determine an AC frequency response of the load; and/or the controller may be configured to operate the second ode digital-to-analog (DAC) to repeatedly increase the DC signal according to any method, such as a ramp step or binary search (and optionally during a positive slope), at the reference node to perform a peak detect on the generated alternating current (AC) signal.

According to another embodiment, an apparatus may include a controller configured to couple to an amplifier circuit and determine at least one characteristic of a load coupled to the amplifier, wherein the controller is configured to perform the steps of: applying a first current from a first digital-to-analog converter (DAC) to a load through a switch; receiving an indication of a first voltage across the load resulting from the application of the first current; applying a second current from a second digital-to-analog converter (DAC) to a reference load; receiving an indication of a second voltage across the reference load resulting from the application of the second current; and/or comparing a first voltage across the load with a second voltage across the reference load.

In certain embodiments, the controller may be configured to apply a direct current (DC) signal as the first current from the first digital-to-analog converter (DAC) and to determine a DC impedance of the load; the controller may be further configured to perform steps comprising adjusting the second current from the second digital-to-analog converter (DAC) to the reference load, wherein the adjustment comprises a step ramp of the second digital-to-analog converter (DAC); the controller may be further configured to perform steps comprising adjusting the second current from the second digital-to-analog converter (DAC) to the reference load, wherein the adjustment comprises a portion of a binary search for a current level at which the first voltage and the second voltage are approximately equal; the controller may be configured to determine a DC impedance of a transducer coupled to an audio amplifier and to identify the transducer based, at least in part, on the determined DC impedance of the transducer; the controller may be further configured to apply an alternating current (AC) signal as the first current from the first digital-to-analog converter (DAC) and to determine an AC frequency response of the load; the load may be a transducer for reproducing audio, and wherein the controller is configured to identify the transducer based, at least in part, on the determined DC impedance of the load and the determined AC frequency response of the load; the controller may be configured to apply an alternating current (AC) signal as the first current from the first digital-to-analog converter (DAC) and to determine an AC frequency response of the load; the load may be a transducer for reproducing audio, and wherein the controller is configured to identify the transducer based, at least in part, on the determined AC frequency response of the load; the controller may be configured to operate the second digital-to-analog (DAC) to repeatedly increase the DC signal according to any method, such as a ramp step or binary search (and optionally during a positive slope), at the reference node to perform a peak detect on the generated alternating current (AC) signal.

According to another embodiment, a method may include applying a first current from a first digital-to-analog converter (DAC) to a load through a switch; receiving an indication of a first voltage across the load resulting from the application of the first current; applying a second current from a second digital-to-analog converter (DAC) to a reference load; receiving an indication of a second voltage across the reference load resulting from the application of the second current; and/or comparing a first voltage across the load with a second voltage across the reference load.

In some embodiments, the method may further include adjusting the second current from the second digital-to-analog converter (DAC) to the reference load, wherein the adjustment comprises a step ramp of the second digital-to-analog converter (DAC); adjusting the second current from the second digital-to-analog converter (DAC) to the reference load, wherein the adjustment comprises a portion of a binary search for a current level at which the first voltage and the second voltage are approximately equal; determining a DC impedance of a transducer coupled to an audio amplifier; identifying the transducer based, at least in part, on the determined DC impedance of the transducer; applying a third current comprising alternating current (AC) from the first digital-to-analog converter (DAC); determining an AC frequency response of the load; and/or operating the second digital-to-analog (DAC) to repeatedly increase the DC signal according to any method, such as a ramp step or binary search (and optionally during a positive slope), at the reference node to perform a peak detect on the generated alternating current (AC) signal.

In certain embodiments, the step of applying the first current may include applying a direct current (DC) signal, and wherein the method further comprises a step of determining a DC impedance of the load based on the step of comparing the first voltage with the second voltage; and/or the step of applying the first current comprises applying an alternating current (AC) signal, and wherein the method further comprises a step of determining an AC frequency response of the load based on the step of comparing the first voltage with the second voltage.

According to one embodiment, an apparatus may include a first output node configured to couple to a load; a first digital-to-analog converter (DAC) coupled to the first output node; sense circuitry coupled to the first output node; a reference generator; a second digital-to-analog converter (DAC) coupled to the reference generator; an analog-to-digital converter (ADC) coupled to the sense circuitry and coupled to the reference generator; a temperature sensor configured to measure a temperature; and digital circuitry coupled to the first digital-to-analog converter (DAC) and coupled to the second digital-to-analog converter (DAC) and coupled to the analog-to-digital converter (ADC) and configured to control at least one of the first digital-to-analog converter (DAC) and the second digital-to-analog converter (DAC) to determine an impedance of the load based, at least in part, on the measured temperature and an output of the analog-to-digital converter (ADC).

According to another embodiment, an apparatus may include digital circuitry configured to determine an impedance of a load, wherein the digital circuitry is configured to perform the steps including applying a first signal to a load; determining a characteristic of the load based on the applied first signal; applying a second signal to a reference generator; determining a characteristic of the reference generator in response to the applied second signal; comparing the determined characteristics of the load and of the reference generator; receiving a measured temperature; and determining the impedance of the load based, at least in part, on the compared characteristics of the load and of the reference generator and on the received temperature.

According to a further embodiment, a method for determining an impedance of a load may include applying a first signal to a load; determining a characteristic of the load based on the applied first signal; applying a second signal to a reference generator; determining a characteristic of the reference generator in response to the applied second signal; comparing the determined characteristics of the load and of the reference generator; receiving a measured temperature; and determining the impedance of the load based, at least in part, on the compared characteristics of the load and of the reference generator and on the received temperature.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
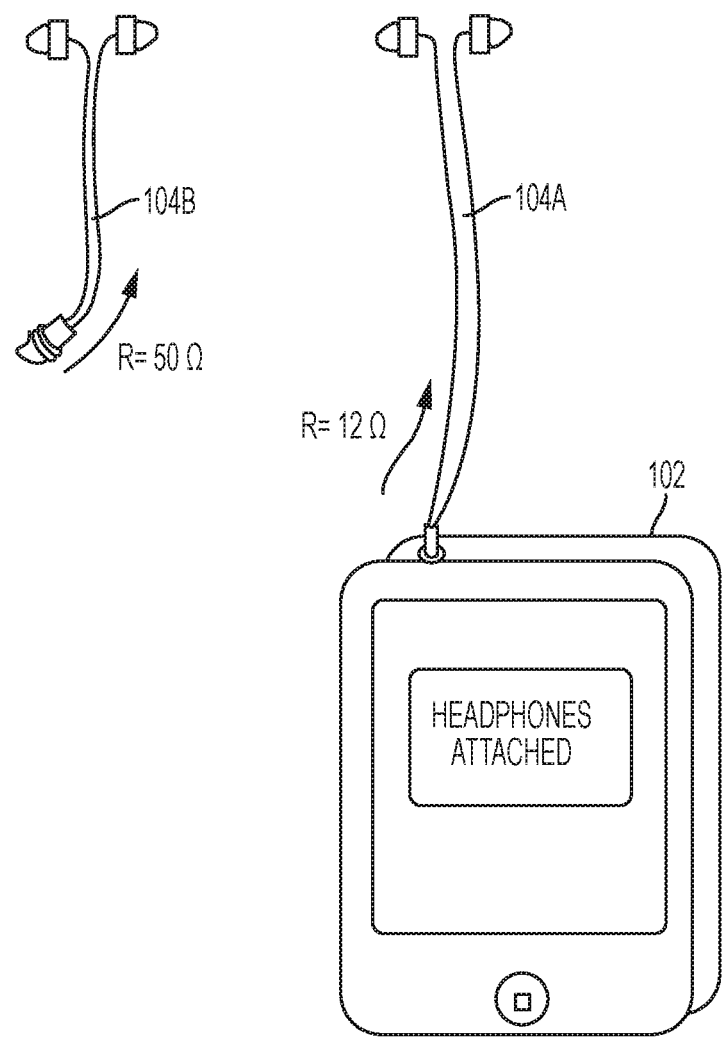
FIG. 1 is a drawing illustrating a conventional smartphone detecting when headphones are attached to an audio output according to the prior art.
Figure 2A:
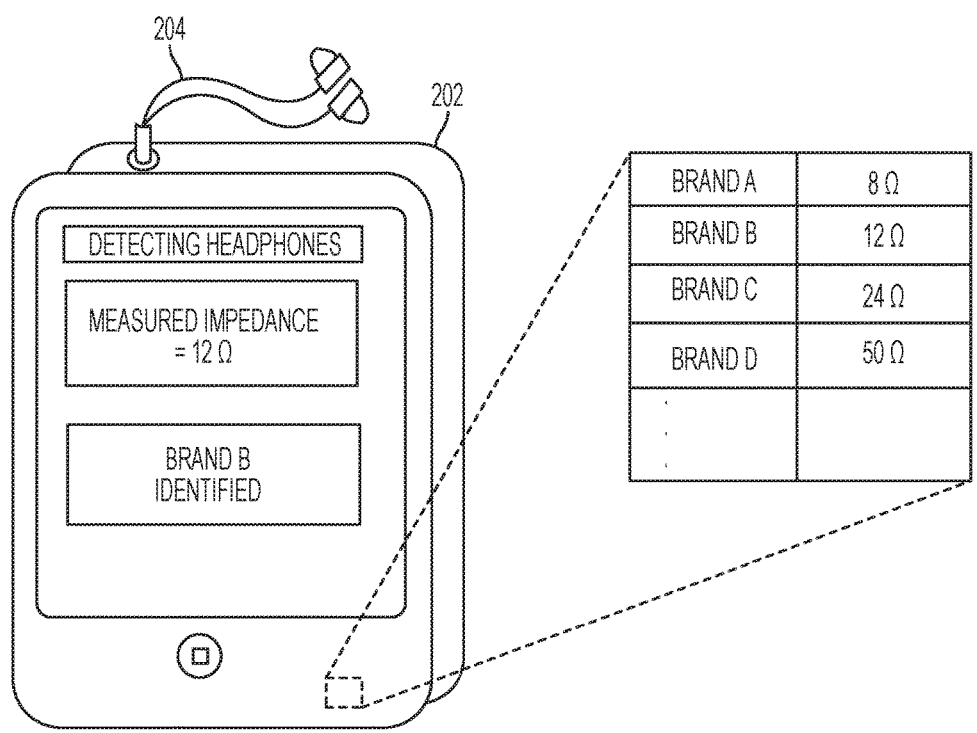
FIG. 2A is a drawing illustrating an example portable audio device detecting load characteristics of headphones attached to an audio output according to one embodiment of the disclosure.

FIG. 2A is a drawing illustrating an example portable audio device detecting load characteristics of headphones attached to an audio output according to one embodiment of the disclosure. A portable audio device 202, such as a smartphone or MP3 player, may include an application processor, memory, a display, and one or more audio components. The audio components may include an audio codec, a digital signal processor (DSP), an analog-to-digital converter (ADC), a digital-to-analog converter (DAC), and/or an amplifier. When a set of headphones 204 is attached to the device 202, the device 202 may detect the connection through an audio plug and determine that headphones, or another transducer or speaker, have been attached. This detection may trigger the device 202, such as through an audio component or the application processor, to determine characteristics of the attached headphones 204. For example, the audio component may perform measurements to determine direct current (DC) or alternating current (AC) load characteristics of the attached headphones 204. In one embodiment, the measurements include a DC impedance, which may be 12 ohms for the headphones 204. This measurement, along with additional information or measurements, may be provided from the audio component to the application processor. The application processor may then compare the measured characteristics to known databases, either stored locally or retrieved from a network location, to identify with particularity the brand, model, or other information regarding the attached headphones 204. In the example of a 12 ohm DC impedance described above, the device 202 may identify the headphones 204 as "Brand B" headphones. The device 202 may then take further action based on the determination regarding the headphones 204. For example, the device 202 may apply equalization levels specifically chosen to improve the sound quality from audio playback through the headphones 204. As another example, the device 202 may adapt audio post-processing for specific original equipment manufacturer (OEM)-bundled and third-party headphones, headsets, Bluetooth™ speakers, and home and auto audio systems.

One or more measurements of the attached headphones 204 may be performed by a variety of circuitry. For example, a load impedance of the headphones may be measured by circuitry configured to detect an impedance. That circuitry may be coupled to an audio output port of the device 202, such as a headphone plug. In one embodiment, that circuitry may be based on a digital-to-analog converter (DAC) present in an audio codec or other integrated circuit (IC) controller contained in the device 202.

Figure 2B:
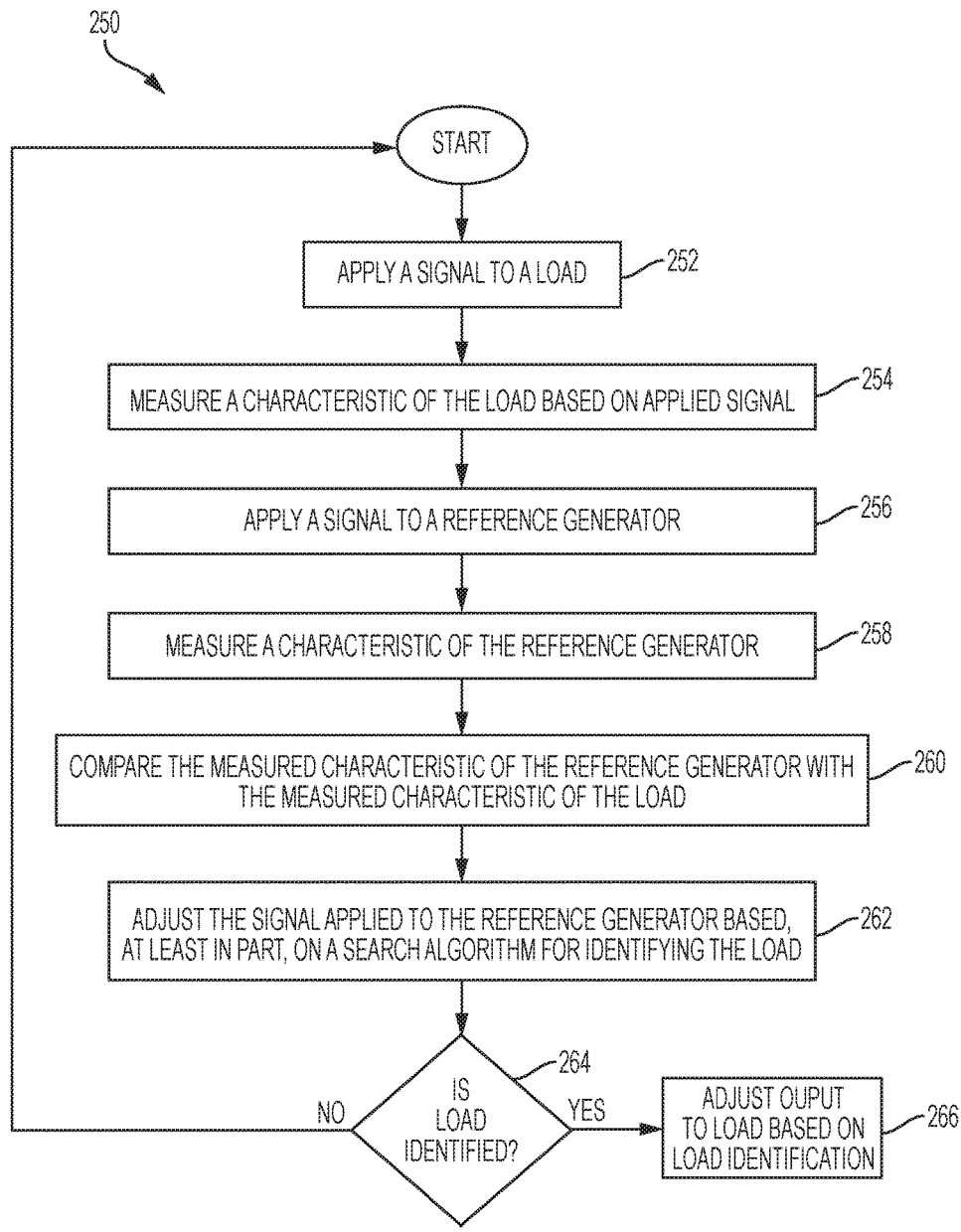
FIG. 2B is a flow chart illustrating an example method for identifying a load according to one embodiment of the disclosure.

FIG. 2B is a flow chart illustrating an example method for identifying a load according to one embodiment of the disclosure. The load may be identified by using a search algorithm to control the application signals to the load and/or a reference generator. The search algorithm may be configured as part of a controller, a digital-to-analog converter (DAC), an audio codec, digital logic circuitry, or other circuitry. The search algorithm may be either hard-wired or contained in a computer program product such as software or firmware. A method 250 may begin at block 252 with applying a signal to a load. The signal of block 252 may be, for example, a direct current (DC) and/or alternating current (AC) voltage or current signal. The load may respond to the applied signal, and a characteristic of the load measured at block 254 that corresponds to the load's response. The measured characteristic may be, for example, a voltage across or a current through the load at the applied signal. At block 256, a signal may be applied to a reference generator, which produces a response from the reference generator corresponding to the applied signal. That response may be determined by measuring a characteristic of, such as a voltage across or a current through, the reference generator at block 258 in response to the applied signal.

The responses of the reference generator and the load to the applied signals of blocks 252 and 256 may be compared at block 260. Based, in part, on the comparison at block 260, a search algorithm may execute to adjust, at block 262, one or more of the applied signals at blocks 252 and 256. For example, the applied signal to the reference generator at block 258 may be increased or decreased at block 262 until the measured characteristic of the reference generator at block 258 is within a threshold amount of the measured characteristic of the load at block 254. When the threshold is achieved, the search algorithm may identify the load at block 264. Otherwise, one or more steps of method 250 may be repeated until a load is sufficiently identified at block 264. The load identification at block 264 may be based on an impedance of the load calculated by the comparison at block 260 of the measured characteristics of the reference generator and the load. The determined impedance may be compared to previously-measured impedances for various loads to identify the load. Because impedance measurements may be affected by temperature, in some embodiments compensation may be applied to the determined impedance based on the temperature. Such compensation may be applied as described with reference to FIG. 14, FIG. 15, FIG. 16, and FIG. 17 below.

After a load is identified, the output to the load may be adjusted based on known characteristics of the identified load. At block 266, an output to a load may be adjusted based on the load identification. For example, as described above with reference to FIG. 2A, when a headphone brand or model is identified, the audio signal output to the headphone may be adjusted to compensate for a frequency response of the headphones. In other embodiments, other transducers, such as a speaker may be identified by the method 250 of FIG. 2B. Although block 260 describes adjusting the signal to the reference generator and fixing the signal applied to the load as part of the process to identify the load, the signal to the load may also be varied and compared to a fixed output of the reference generator.

Figure 3A:
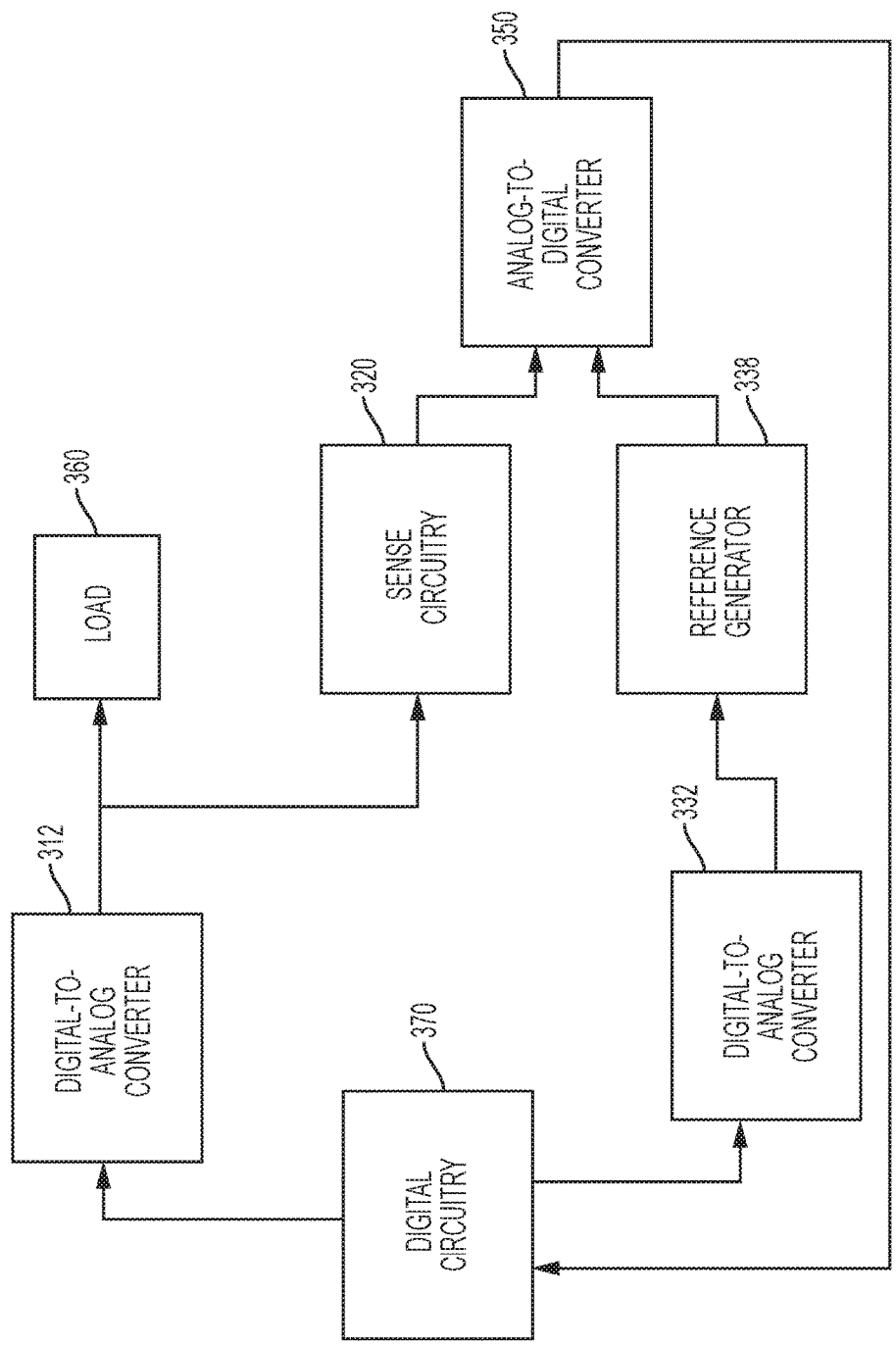
FIG. 3A is an example block diagram illustrating an apparatus for identifying a load according to one embodiment of the disclosure.

FIG. 3A is an example block diagram illustrating an apparatus for identifying a load according to one embodiment of the disclosure. An apparatus for identifying a load 360 may include sense circuitry 320 coupled to the load 360 for measuring a characteristic of the load 360. The measured characteristic may be provided to an analog-to-digital converter (ADC) 350. The ADC 350 may also receive a reference signal generated by a reference generator 338. The reference generator 338 may include, for example, a resistor that converts a current value to a voltage value. The ADC 350 may compare the measured characteristic from the sense circuitry 320 and the reference signal generated by the reference generator 338. In one embodiment, the ADC 350 may be a comparator that receives two analog input signals from the sense circuitry 320 and the reference generator 338 and is configured to output a digital signal indicating which one of the two input signals is a higher value. For example, the ADC 350 may output a "0" when the reference signal is lower than the measured characteristic and output a "1" when the reference signal is higher than the measured characteristic.

The ADC 350 may provide the digital output to digital circuitry 370, such as a controller or another component with logic circuitry. In some embodiments, the digital circuitry 370 may include an input node coupled to a delta-sigma modulator, in which the delta-sigma modulator drives switches (not shown) in the DACs 312 and 332 through an analog fast impulse response (FIR) filter.

The digital circuitry 370 may be coupled to the first digital-to-analog converter (DAC) 312 and coupled to the second digital-to-analog converter (DAC) 332 and coupled to the analog-to-digital converter (ADC) 350 and configured to control at least one of the first digital-to-analog converter (DAC) 312 and the second digital-to-analog converter (DAC) 332 to identify the load. The digital circuitry 370 may control the DACs 312 and 332 to output a signal to the load 360 and/or the reference generator 338 in response to the output of the ADC 350. For example, when the ADC 350 output is "0," the digital circuitry 370 may cause the DAC 332 to increase an amplitude of the signal applied to reference generator 338, and when the ADC 350 output is "1," the digital circuitry 370 may cause the DAC 332 to decrease an amplitude of the signal applied to reference generator 338. In some embodiments, the digital circuitry 370 may control other aspects of DAC 332, such as a frequency of an applied signal. In some embodiments, the digital circuitry 370 may also adjust an output of DAC 312 in response to the output of ADC 350. Further, in some embodiments, the digital circuitry 370 may adjust an output of the DAC 312, such as to control a frequency of a signal applied to the load 360 to measure characteristics of the load 360 at different frequencies. The DACs 312 and 332 may include, for example, a current mode DAC, a voltage mode DAC, and/or an amplifier.

The digital circuitry 370 may be configured, such as through hard-wiring, firmware, and/or software, to control components to execute a search algorithm to identify a load or characterize the load. For example, the digital circuitry 370 may be configured to control at least one of the first digital-to-analog converter (DAC) and the second digital-to-analog converter (DAC) based on a search algorithm to identify or characterize the load. The search algorithm may include a binary search algorithm, a step ramp search algorithm, other search algorithms, or a combination or sequence of several search algorithms. The digital circuitry 370 may be configured to execute a search algorithm by being configured to operate the first digital-to-analog (DAC) 312 to generate a direct current (DC) signal at the first output node, wherein the analog-to-digital converter (ADC) 350 is configured to generate an output digital signal based, at least in part, on a sensed value measured by the sense circuitry 320; to operate the second digital-to-analog (DAC) 322 to generate, by the reference generator 338, a reference input ($V_{REF}$) for the analog-to-digital converter (ADC) 350, wherein the analog-to-digital converter (ADC) 350 is configured to generate the output digital signal based, at least in part, on the reference input $V_{REF}$; and to monitor an output of the analog-to-digital converter (ADC) 350 to determine a DC and/or AC impedance of the load 360.

In one embodiment, the digital circuitry 370 configured to determine at least one characteristic of a load, by performing steps comprising applying a first AC and/or DC signal to the load 360; determining a characteristic (e.g., voltage or current) of the load 360 based on the applied first signal; applying a second signal to the reference generator 338, such as through the digital-to-analog converter (DAC) 332; determining a characteristic (e.g., voltage or current) of the reference generator 338 in response to the applied second signal; comparing the determined characteristics of the load 360 and of the reference generator 338, such as by evaluating an output of the analog-to-digital converter (ADC) 350; and identifying the load 360 based on the compared characteristics of the load 360 and of the reference generator 338.

Figure 3B:
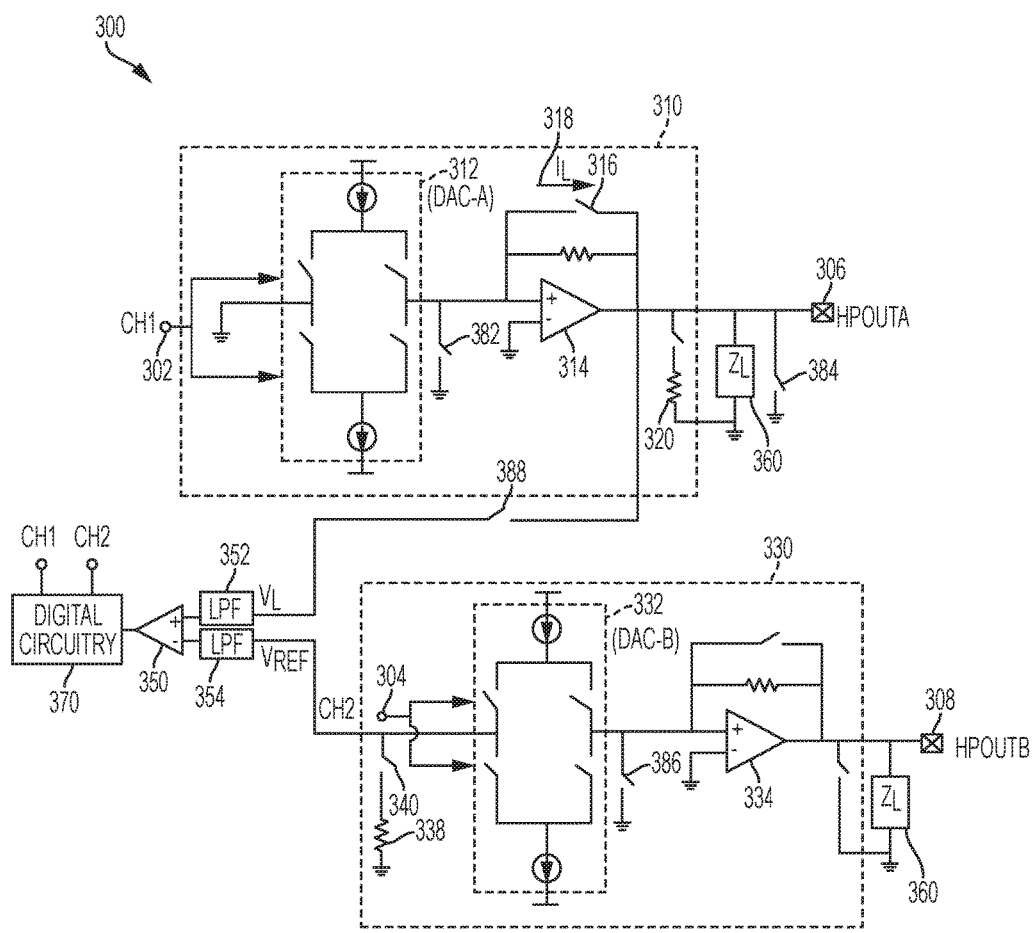
FIG. 3B is an example circuit illustrating a digital-to-analog converter (DAC)-based measurement of load characteristics of headphones according to one embodiment of the disclosure.

One circuit for performing load impedance measurements using current-mode DACs is shown in FIG. 3B. FIG. 3B is an example circuit illustrating a digital-to-analog converter (DAC)-based measurement of load characteristics of headphones according to one embodiment of the disclosure. A circuit 300 includes a first path 310 configured to pass current through an attached load 360, such as headphones attached to the headphone plug. The circuit 300 also includes a second path 330 configured to pass current through a reference component. The output of the first path 310 and the second path 330 is provided to an analog-to-digital converter (ADC) 350, such as an operational amplifier configured as a comparator to produce a digital value corresponding to a comparison of the output of the first path 310 with the output of the second path 330. The ADC 350 may be configured to compare the output from the first path 310, $V_L$, and the output from the second path 330, $V_{REF}$, and generate a signal based on the comparison. That comparison signal may be provided to other circuitry that controls the first path 310 and second path 330 to continue or terminate measurement of the load impedance and to determine characteristics of the load 360. Low pass filters (LPFs) may be coupled between the ADC 350 and the output of paths 310 and 330 to reduce noise in the signals arriving at the ADC 350. A switch 388 may disconnect the first path 310 from the ADC 350. The switch 388 is one example embodiment of the sense circuitry 320, because the switch 388 couples the first output node to the ADC 350 (e.g., comparator 350) to sample a value at the first output node.

Each of the paths 310 and 330 may be based, in part, on current-mode DACs. Path 310 includes DAC-A 312, and path 330 includes DAC-B 332. Switches 382 and 386 may be coupled to DAC-A 312 and DAC-B 332, respectively, to ground the output of the switches 382 and 386. DAC-A 312 is configured to receive control signal CH1 at node 302 and generate a current that is output to the load 360, $Z_L$. In one embodiment, the CH1 input may be coupled to circuitry, such as digital circuitry 370 of FIG. 3A. The input of node 302 may be produced by a delta-sigma modulator. A resistor 320 may be coupled in parallel with the load 360 to provide a defined resistance and prevent the load voltage $V_L$ from rising towards infinity, such as would happen when load 360 has a large resistance. The resistor 320 could thus prevent unintentional popping or clicking noises audible from the headphones when the headphone impedance value is large. A switch 384 may also be coupled to output node 306 to ground the output node 306. During normal operation, current from DAC-A 312 may flow through amplifier 314 to an output node 306, such as a headphone port, to drive audio signals to a transducer of load 360. During measurements, the mute switch 316 may be closed to pass current 318 $I_L$ from the DAC-A 312 to the load 360 without passing through the amplifier 314. Current driven through the load 360 generates a voltage, $V_L$, that may be input to the ADC 350 and used as part of a measurement of the load 360, $Z_L$. DAC-B 332 is configured to receive a control signal CH2 at input node 304 and generate a current that is output to the reference resistor 338. In one embodiment, the CH2 input may be coupled to circuitry, such as digital circuitry 370 of FIG. 3A. The input at node 304 may be received from a delta-sigma modulator. During normal operation, current from DAC-B 332 may flow through the amplifier 334 to output node 308, such as a headphone port, to drive audio signals to a transducer of the load 360. The output nodes 306 and 308 may thus produce a differential signal for driving a transducer. During measurements, switch 340 may close to couple reference resistor 338 to the DAC-B 332. Current driven across the resistor 338 generates a reference voltage, $V_{REF}$, that may be input to the ADC 350 and used as part of a measurement of the load 360, $Z_L$.

The circuit 300 illustrates measurement of the load 360 through the first output node 306, HPOUTA, using the first path 310, while using circuitry of the second path 330 as a reference signal. The operation of the first path 310 and the second path 330 may also be reversed, such that the measurement of the load 360 is performed through the second output node 308, HPOUTB.

Figure 4:
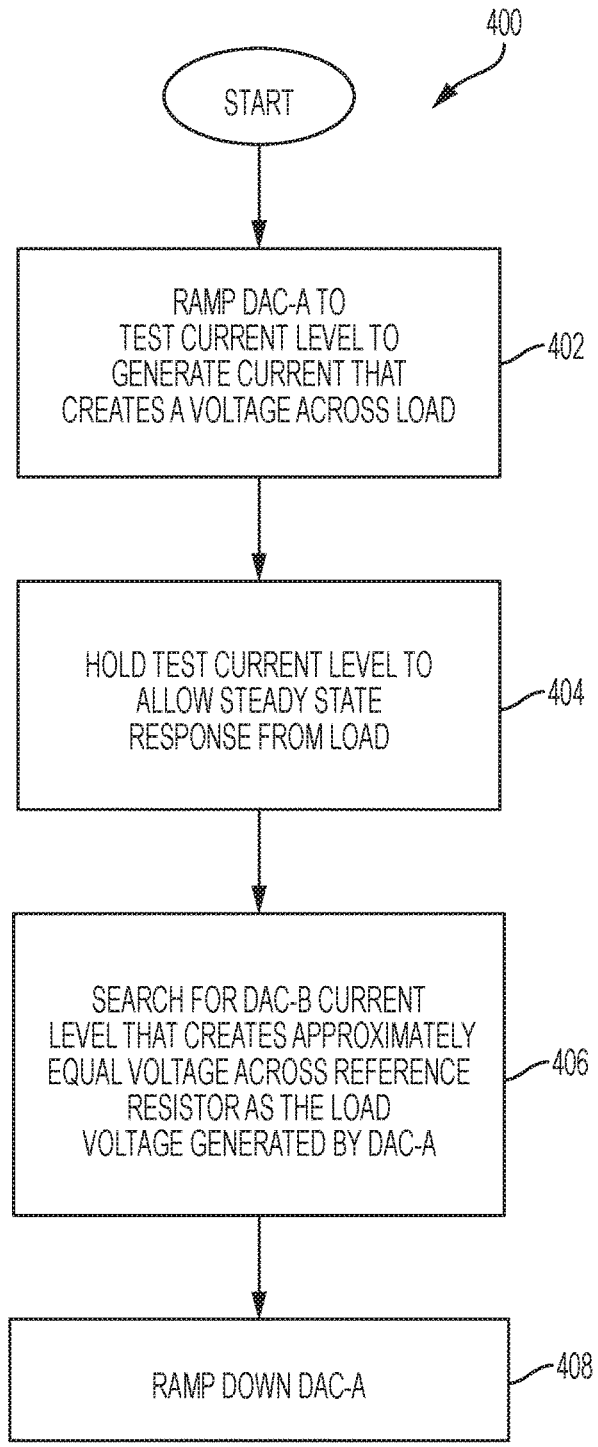
FIG. 4 is an example flow chart illustrating a method of measuring direct current (DC) load characteristics of headphones according to one embodiment of the disclosure.

The operation of the circuit 300 of FIG. 3, such as control of the DAC-A 312 and DAC-B 332 and monitoring the signal at the output of the ADC 350, may be performed by a controller (not shown). The controller may be integrated into an audio component, such as an audio codec. One method of operating the circuit 300 to measure a characteristic of the load is shown in FIG. 4, which may be executed by the controller. In particular, FIG. 4 illustrates a method of measuring direct current (DC) load characteristics of the load 360, $Z_L$. However, the controller may measure DC load characteristics and/or other load characteristics through the illustrated method or other methods.

FIG. 4 is an example flow chart illustrating a method of measuring direct current (DC) load characteristics of headphones according to one embodiment of the disclosure. A method 400 begins at block 402 with ramping the DAC-A 312 to a test current level to generate current that creates a voltage $V_L$ across the load 360. The test current level may be, for example, a current level approximately half way between zero and full scale of the DAC-A 312. The ramp-up may be at a rate slow enough to not generate audible noise from the headphones. Then, at block 404, the test current level may be held by the DAC-A 312 to allow for development of a steady-state response from the load 360. The hold period of block 404 may be a preprogrammed delay value, such as 200 milliseconds, or the circuit 300 may be monitored to determine when steady-state conditions are reached. Next, at block 406, the DAC-B 332 is controlled to generate a current through the reference resistor 338 that results in a reference voltage, $V_{REF}$, that may be compared to the load voltage, $V_L$, by ADC 350. DAC-B 332 may be controlled to vary the current through resistor 338 until a reference voltage $V_{REF}$ is approximately equal to and greater than the load voltage $V_L$, which causes the ADC 350 to toggle output signal from low to high or high to low. This change in output signal may be detected to determine that the load voltage $V_L$ has been determined. After block 406 completes, the final current value may be referred to as $I_{REF}$, and that value used to compute the impedance of the load 360 $Z_L$ by the following equation:

$$Z_L = \frac{R_{REF}}{\frac{I_L}{I_{REF}} - 1},$$

where $R_{REF}$ is the resistance of resistor 320, and $I_L$ is the current applied by DAC-A 312. The manner of varying the current through DAC-B 332 may be performed according to any algorithm, including a step ramp (such as a ramp or a coarse/fine search ramp), a binary search, or other search techniques. After the load voltage $V_L$ has been determined, the method 400 continues to block 408 to ramp down the DAC-A 312 current. The determined $V_L$ voltage level may then be used to determine information regarding the load, such as a DC impedance value, a headphone brand, or headphone model. For example, the determined $V_L$ voltage level may be used to determine a DC impedance of the load by dividing the $V_L$ voltage level by a current produced by DAC-A 312 or some other value. In particular, the $V_L$ voltage level is correlated with the DC impedance of the load $Z_L$ by the following equation:

$$V_L = I_L \frac{R_{REF} Z_L}{R_{REF} + Z_L}$$

Figure 5:
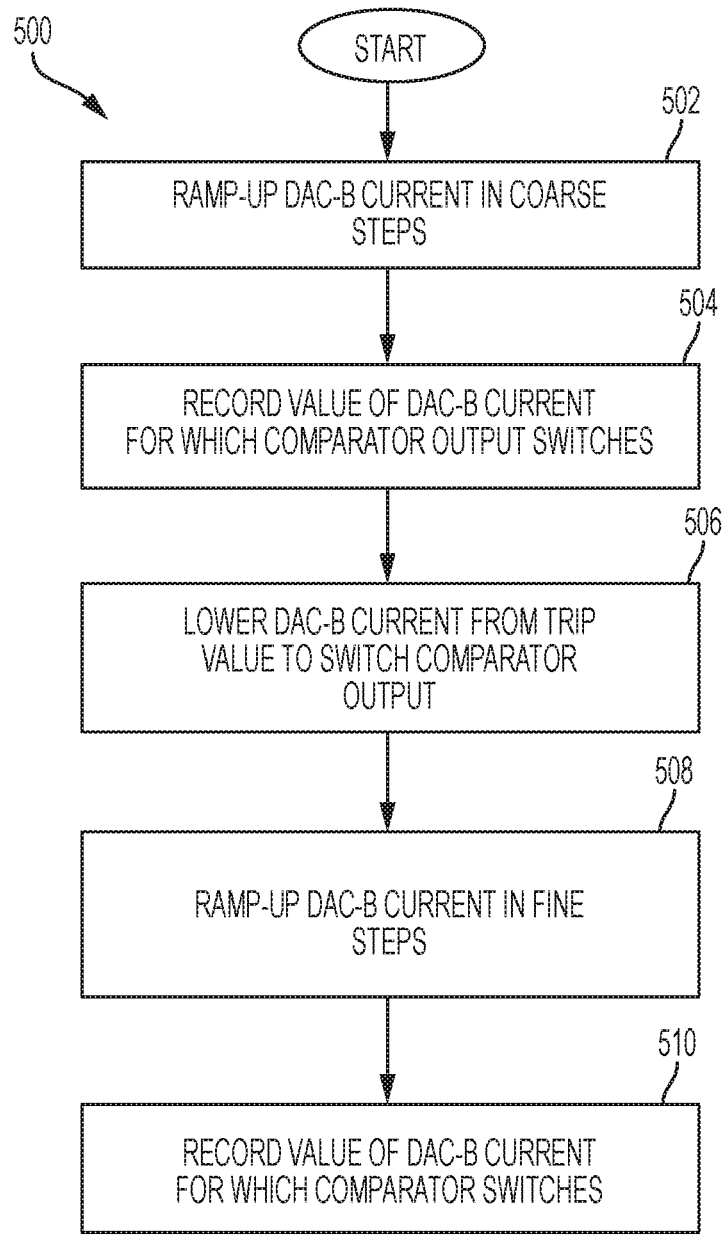
FIG. 5 is an example flow chart illustrating a method of measuring direct current (DC) load characteristics of headphones with a coarse and fine stepping according to one embodiment of the disclosure.

As described above, one example control method for varying the DAC-B 332 current is a coarse/fine search algorithm. One example of a coarse/fine search algorithm is shown in FIG. 5. FIG. 5 is an example flow chart illustrating a method of measuring direct current (DC) load characteristics of headphones with a coarse and fine stepping according to one embodiment of the disclosure. A method 500 begins at block 502 with ramping up the DAC-B 332 current in coarse steps. The ramp may be conducted at a rate of half a clock cycle of the ADC 350 or in continuous-time. The ramp-up of block 502 continues until the ADC 350 output switches. Then, the value of the DAC-B 332 current is recorded at block 504. This recorded value may provide a coarse estimate of the load impedance, which can be calculated from the following equation:

$$Z_{L,coarse} = \frac{R_{REF}}{\frac{I_L}{I_{REF,coarse}} - 1}$$

where $R_{REF}$ is the resistance of resistor 320, $I_L$ is the current applied by DAC-A 312, and $I_{REF,coarse}$ is the value recorded at block 504. Next, at block 506, the DAC-B 332 current is reduced from the value recorded at block 504 to switch the comparator output back to the last state. Then, at block 508, the DAC-B 332 current is again ramped up but in smaller steps than that of the ramp-up of block 502. The fine ramp-up of block 508 is continued until the ADC 350 output switches. Next, at block 510, the DAC-B 332 current is recorded at block 510. This recorded value may provide a finer estimate of the load impedance, which can be calculated from the following equation:

$$Z_{L,fine} = \frac{R_{REF}}{\frac{I_L}{I_{REF,fine}} - 1}$$

where $R_{REF}$ is the resistance of resistor 320, $I_L$ is the current applied by DAC-A 312, and $I_{REF,fine}$ is the value recorded at block 510. The coarse/fine search algorithm of FIG. 5 may reduce the time consumed in determining the load voltage $V_L$. The coarse search of blocks 502 and 504 allow for a quick determination of load voltage $V_L$, and the fine search of blocks 508 and 510 allow for a high precision measurement in a small range of possible load voltage $V_L$ values.

Figure 6:
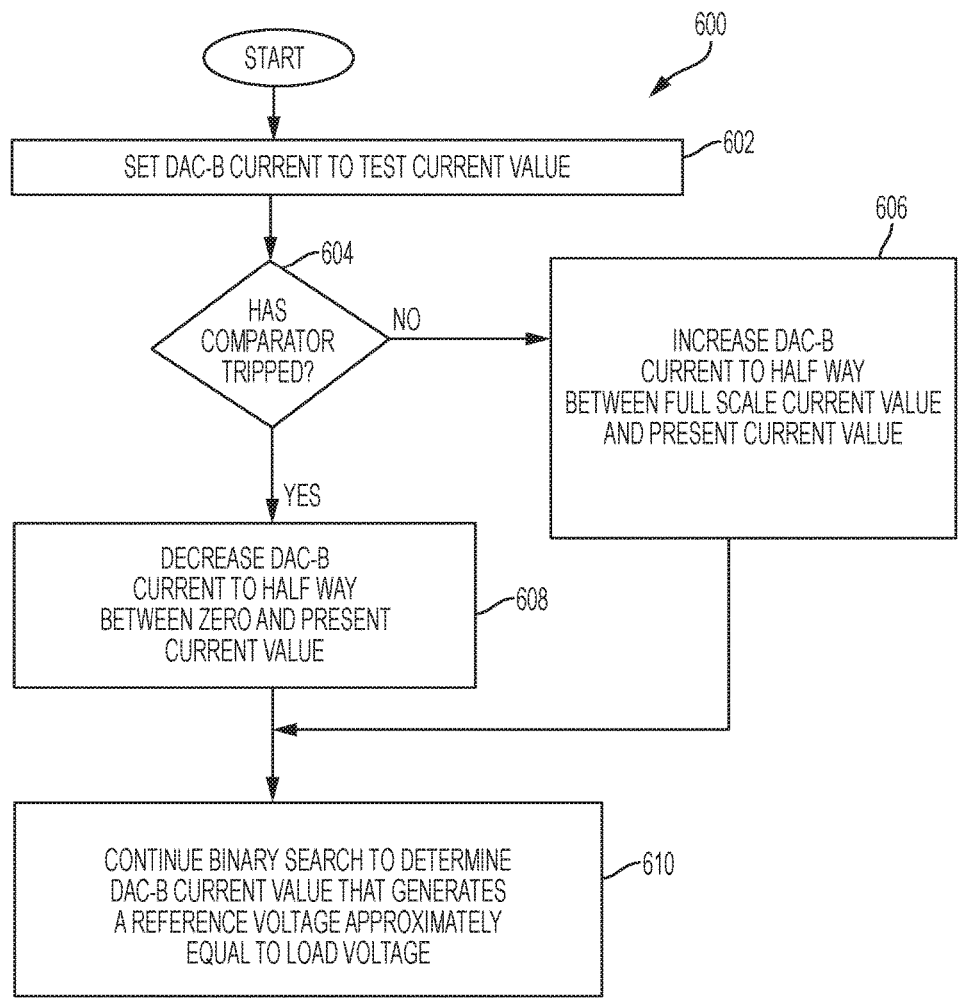
FIG. 6 is an example flow chart illustrating a method of measuring direct current (DC) load characteristics of headphones with a binary search according to one embodiment of the disclosure.

Another example control method for varying the DAC-B 332 current is a binary search algorithm. A binary search algorithm generally operates by splitting a possible range for the load voltage $V_L$ value into two pieces, testing the midpoint between the two pieces, determining whether the actual load voltage $V_L$ value is higher or smaller than the midpoint, and then taking either of the top half or bottom half and again splitting into two pieces and testing the midpoint. This process continues until the approximate load voltage $V_L$ is determined with a desired level of precision. One example of a binary search algorithm is shown in FIG. 6. FIG. 6 is an example flow chart illustrating a method of measuring direct current (DC) load characteristics of headphones with a binary search according to one embodiment of the disclosure. A method 600 begins at block 602 with setting the DAC-B 332 current to a test current value, such as half scale value. Then, at block 604, it is determined if the ADC 350 output changes. If not, then the actual load voltage $V_L$ value is higher than the test current value. The method 600 thus continues to block 606 to increase the DAC-B 332 current to half way between the full scale current value and the present (test current) current value. If the ADC 350 output changes at block 604, then the actual load voltage $V_L$ value is lower than the test current value. The method 600 thus continues to block 608 to decrease the DAC-B 332 current to half way between zero and the present (test current) current value. At block 610, the binary search algorithm continues as in blocks 604, 606, and 608 until a DAC-B 332 current value is determined to generate a reference voltage $V_{REF}$ approximately equal to the load voltage $V_L$.

Figure 7:
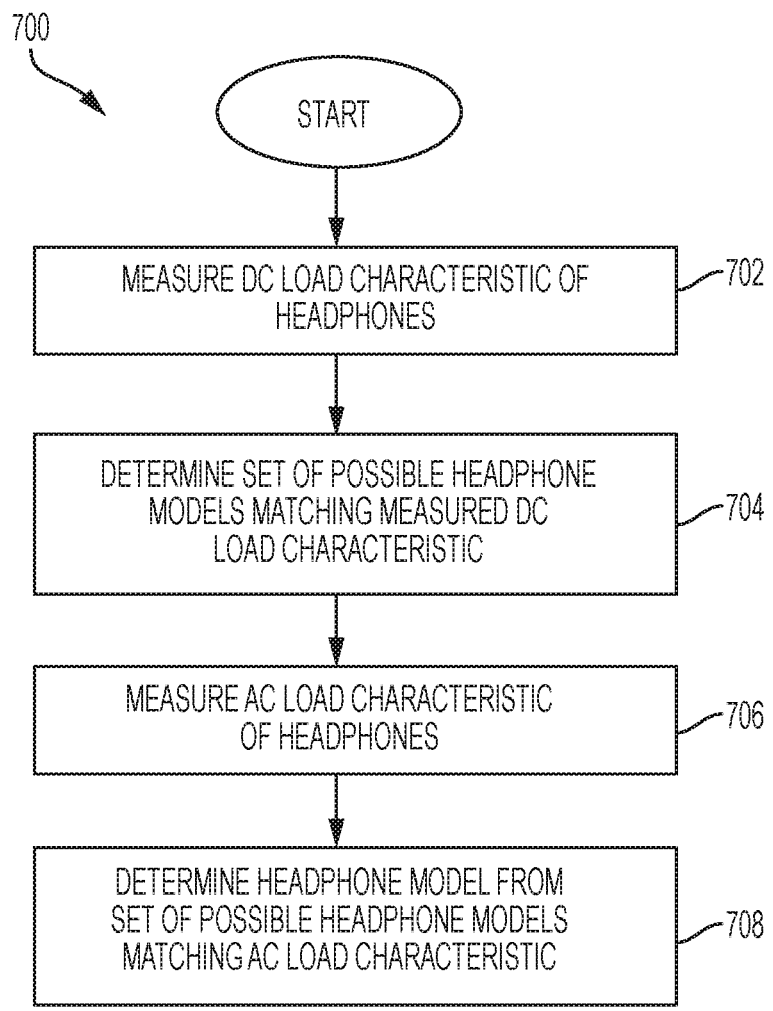
FIG. 7 is an example flow chart illustrating a method of determining a headphone model based on direct current (DC) and/or alternating current (AC) load characteristics of the headphones according to one embodiment of the disclosure.

The techniques for load characterization described above with reference to FIG. 4, FIG. 5, and FIG. 6 may generally be executed to determine a DC load impedance value for the load 360, $Z_L$. AC load impedance characteristics may also be measured using the circuit 300, and the results of the DC and AC characteristics combined to improve precision in identifying the load. One identification method using both DC and AC characteristics is illustrated in FIG. 7. FIG. 7 is an example flow chart illustrating a method of determining a headphone model based on direct current (DC) and/or alternating current (AC) load characteristics of the headphones according to one embodiment of the disclosure. A method 700 begins at block 702 with measuring DC load characteristics of the headphones. Block 702 may include executing one or more of the methods described in FIG. 4, FIG. 5, and/or FIG. 6. Then, at block 704, a set of possible headphone models is determined that match the measured DC load characteristic of block 702. When more than one possible headphone models match the measured characteristics of the connected headphones, further characterization of the headphones may be useful in more particularly identifying the headphones. Thus, at block 706, AC load characteristics of the headphones are measured. Block 706 may include multiple AC measurements at different frequencies. In one embodiment, block 706 may continue performing AC measurements until a model of headphone may be determined with sufficient accuracy. Then, at block 708, the set of possible headphone models may be reduced based on the measured AC characteristics of block 706. This may result in reducing the set down to one possible match for headphones. The mobile audio device may then take action based on the determined headphone model at block 708.

Figure 8:
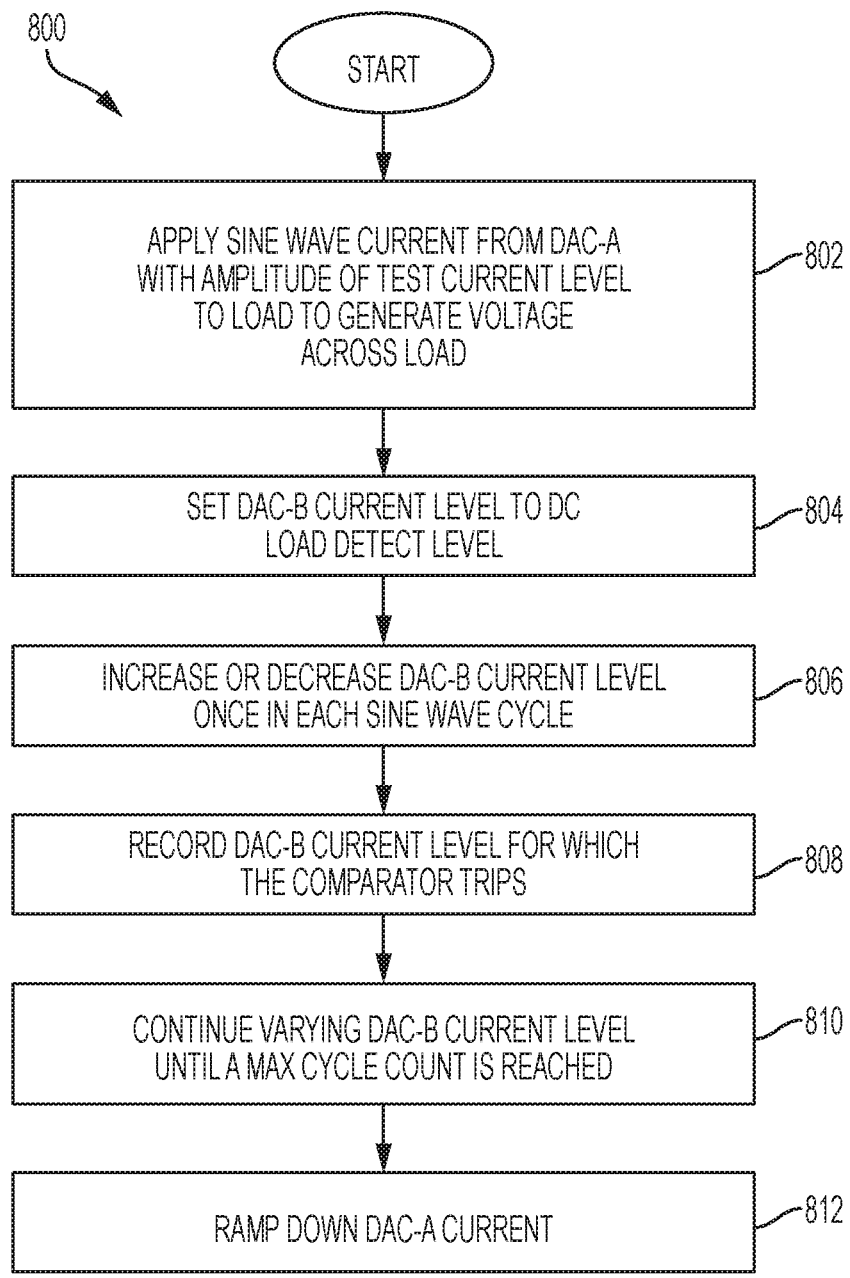
FIG. 8 is an example flow chart illustrating a method of measuring alternating current (AC) load characteristics of headphones according to one embodiment of the disclosure.

FIG. 8 is an example flow chart illustrating a method of measuring alternating current (AC) load characteristics of headphones according to one embodiment of the disclosure. The AC load characteristic measurement of method 800 may be performed similarly to that of the DC load characteristic measurement of block 702, except by controlling DAC-A 312 to apply an alternating current (AC) signal to the load 360. The method 800 begins at block 802 with applying a sine wave current source from DAC-A 312 to the load with an amplitude of a test current level to generate a voltage across the load. This test current level, applied as current $I_L$ to load 360, may generate a voltage across the load 360 calculated by the following equation:

$$V_L = I_L \frac{R_{REF} Z_{L,AC}}{R_{REF} + Z_{L,AC}}$$

At block 804, the DAC-B 332 is set to a predetermined value, such as the DC load detect value measured by the method of FIG. 4, FIG. 5, or FIG. 6. An amplitude of the DC signal generated by the DAC-B 332 may be varied to generate different current levels. Next, at block 806, the DAC-B 332 current is increased or decreased once in each sine wave cycle. At block 808, the DAC-B 332 current level that causes the ADC 350 output to change is recorded as the AC impedance value. The recorded current level, $I_{REF,AC}$ may be used to calculate the load 360 impedance according to the following equation:

$$Z_{L,AC} = \frac{R_{REF}}{\frac{I_L}{I_{REF,AC}} - 1}$$

where $R_{REF}$ is the resistance of resistor 320 and $I_L$ is the current applied by DAC-A 312. At block 810, the DAC-B 332 current is varied until a maximum cycle count is reached. At block 812, the DAC-A 312 current is ramped down. The method of FIG. 8 may be repeated for different frequency sine waves generated by the DAC-A 312 and the DAC-B 332. Thus, for example, a frequency response profile of the microphone may be recorded.

The varying of DAC-B current levels at block 810 may include, for example, executing a binary search algorithm, a peak detection algorithm, or another control technique. A binary search technique in AC detection may consume up to about nine cycles to reach to the final value (within the desired error margin). However, a nine cycle delay is a significant amount of delay at low frequencies. To reduce delay time, a digital peak detect may be performed, in which the DAC-B current is ramped up along a positive slope of the sine wave until the ADC 350 output switches. Thus, instead of causing the reference voltage $V_{REF}$ to change only once per cycle as with a binary search, the reference voltage $V_{REF}$ may be increased multiple times or continuously during the sine wave to reach the peak. For low frequencies, this digital peak detect technique may reduce delay to four or five cycles.

Figure 9:
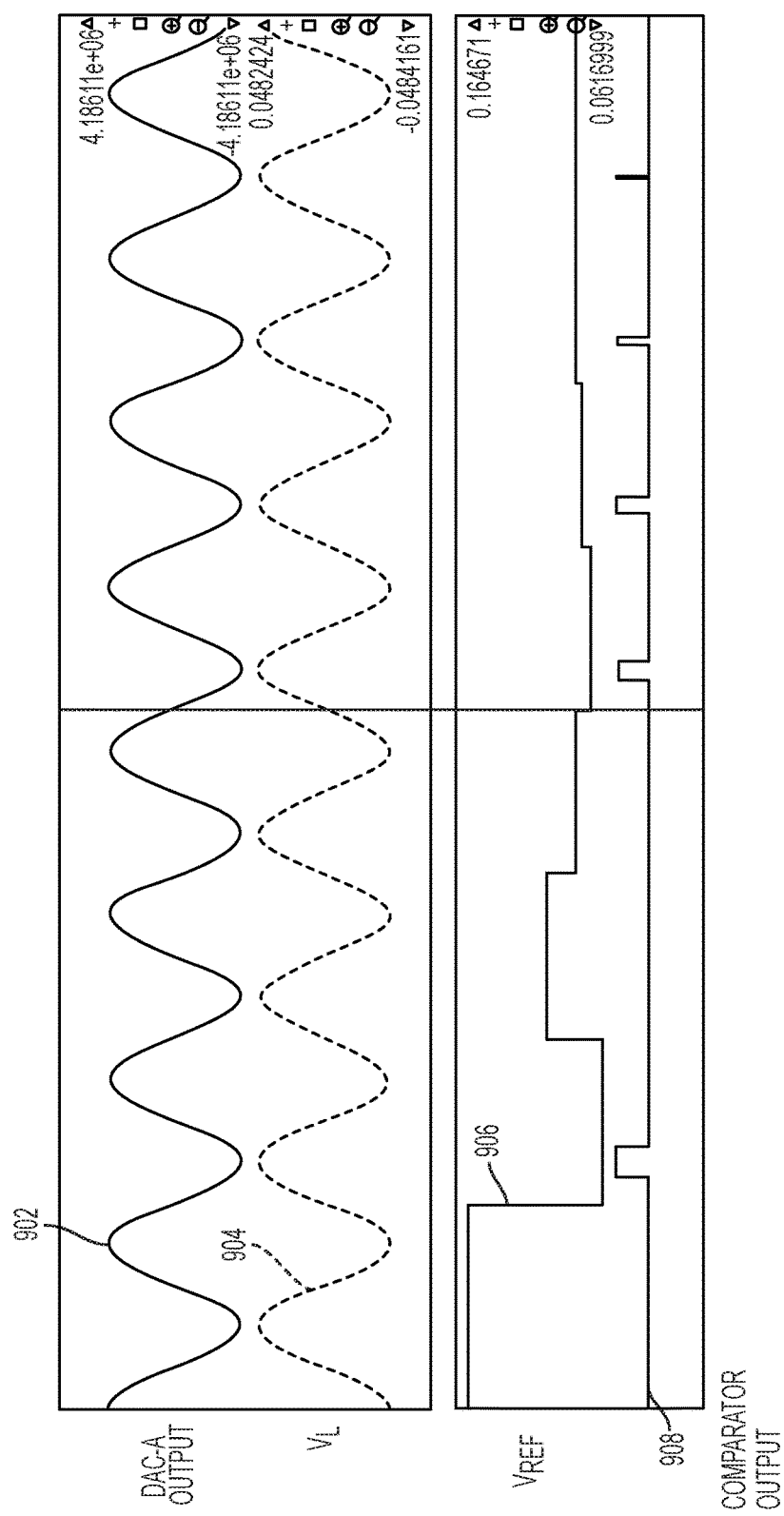
FIG. 9 is an example timing diagram illustrating an alternating current (AC) load characteristic measurement for one frequency according to one embodiment of the disclosure.

A timing diagram illustrating one AC measurement technique as described using a binary search algorithm above is shown in FIG. 9. FIG. 9 is an example timing diagram illustrating an alternating current (AC) load characteristic measurement for one frequency according to one embodiment of the disclosure. In FIG. 9, graph 902 illustrates a sine wave output of DAC-A 312, which is applied to the load 360 being measured. The applied current to the load 360 creates a load voltage $V_L$ shown in graph 904, which is input to ADC 350. A reference voltage $V_{REF}$, also input to the ADC 350 for comparison to the load voltage $V_L$, is shown in graph 906. The DAC-B 332 output is controlled to obtain desired reference voltages $V_{REF}$ shown in graph 906. The graph 906 shows the reference voltage $V_{REF}$ changing once per cycle of the graph 904; however, the $V_{REF}$ changes may occur less or more frequently. An output of the ADC 350 is shown in graph 908. The switches in the ADC 350 output may be recorded and used to determine a characteristic of the load 360, such as an impedance of the load 360 at the frequency of the sine wave generated by the DAC-A 312.

The methods of FIG. 4, FIG. 5, FIG. 6, FIG. 7, and FIG. 8 may be executed on circuitry such as that illustrated in FIG. 3. In the circuitry of FIG. 3, a comparator offset may exist. For example, without taking into account the offset, the ADC 350 may trip when $V_L = V_{REF}$, such that the load 360 can be calculated from the following equation:

$$Z_L = Z_0 = \frac{R_{REF}}{\frac{I_L}{I_{REF}} - 1}$$

When a comparator offset, $V_{OS}$, is taken into account the ADC 350 may trip when $V_L = V_{REF} - V_{OS}$, such that the load 360 can be calculated from the following equation:

$$Z_L = Z_0 \left( \frac{1 - \frac{V_{OS}}{I_{REF} R_{REF}}}{1 + \frac{V_{OS}}{(I_L - I_{REF}) R_{REF}}} \right)$$

With DAC offsets, $I_{OFF1}$ and $I_{OFF2}$ corresponding to DAC-A and DAC-B offsets, taken into account, the load 360 can be calculated from the following equation:

$$Z_L = Z_0 \left( \frac{1 - \left( \frac{V_{OS} - I_{OFF2} R_{REF}}{I_{REF} R_{REF}} \right)}{1 + \left( \frac{V_{OS} - (I_{OFF1} + I_{OFF2}) R_{REF}}{(I_L - I_{REF}) R_{REF}} \right)} \right)$$

If $V_{OS} = I_{OFF2} R_{REF}$, then the numerator of the above equation is equal to zero. This can be accomplished in a circuit by passing the current $I_{OFF2}$ through $R_{REF}$ and comparing it against $V_{OS}$. A circuit topology for performing such a calibration is shown in FIG. 10.

Figure 10:
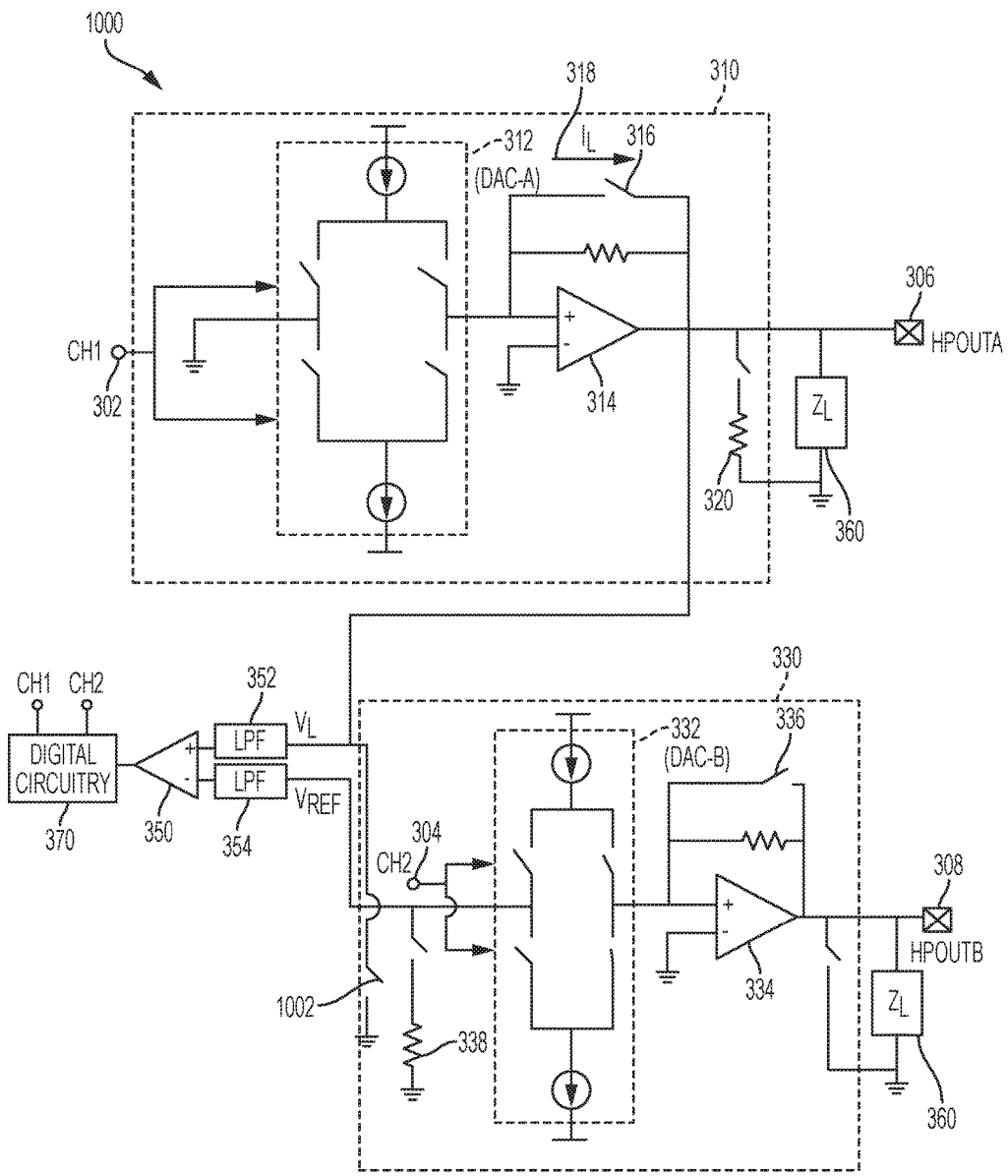
FIG. 10 is an example circuit illustrating a digital-to-analog converter (DAC)-based measurement of load characteristics of headphones with an ability to compensate for comparator offset according to one embodiment of the disclosure.

FIG. 10 is an example circuit illustrating a digital-to-analog converter (DAC)-based measurement of load characteristics of headphones with an ability to compensate for comparator offset according to one embodiment of the disclosure. Circuit 1000 of FIG. 10 is similar to the circuit 300 of FIG. 3 but includes a switch 1002 coupling one input of the ADC 350 to ground. The switch 1002 may be controlled to cancel the effect of offset in ADC 350. That is, the switch 1002 may be activated to couple one input of the ADC 350 to ground to determine a voltage offset of the ADC 350. Then, that known offset voltage may be compensated for in later measurements, such as measurements of the load voltage $V_L$. One method for calibrating the circuit to determine the offset may include toggling switch 1002 to ground non-inverting input of the ADC 350 and driving a current from DAC-B 332 through resistance 338. Because the same ADC 350 is used to measure DAC offset, then $I_{OFF2} = V_{OS2}/R_{REF}$, and then the load 360 may be computed from the following equation:

$$Z_L = Z_0 \left( \frac{1}{1 - \frac{I_{OFF1}}{(I_L - I_{REF})}} \right)$$

Thus, the comparator offset is cancelled and the only remaining offset is $I_{OFF1}$ corresponding to DAC-A, however, this can be reduced by a DAC-A offset calibration.

The search algorithms described above may execute until certain criteria are satisfied. For example, the search algorithm may continue to search and control application of currents to loads until a load has been uniquely determined such that a particular headphone make and model plugged into the headphone port can be identified. As another example, the search algorithm may continue to search and control application of currents to loads until a characteristic of a load has been determined to within a desired error tolerance. That is, the search algorithm may continue until an impedance of a load is determined to within +/−10 Ohms or until an identification of a load is determined to be one of only five possible make and models of headphones. In each of these examples, the search algorithm continues executing until a threshold condition is satisfied, and that threshold condition may be determined based on when a voltage across the load being characterized is approximately equal to a voltage generated by a reference generator. In some embodiments, the search algorithm may terminate in only nine or fewer cycles, thus allowing a measurement of the load relatively quickly, even when characterizing an AC response of the load at low frequencies. One algorithm for determining when to terminate the search algorithm is shown in FIG. 11.

Figure 11:
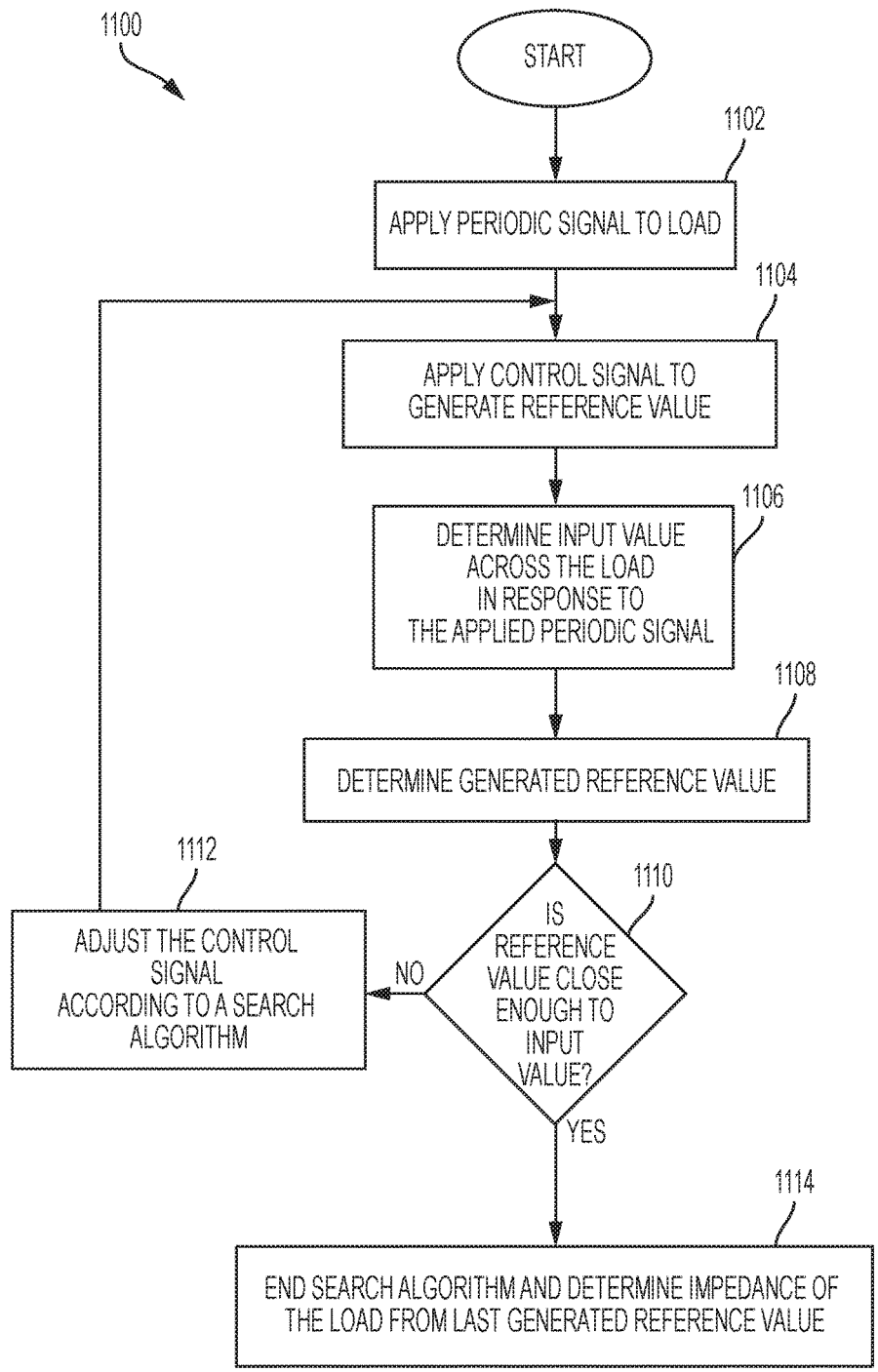
FIG. 11 is an example flow chart illustrating a method of searching for a generated reference value that approximately equals a voltage across a load that may be used, at least in part, to identify a load according to one embodiment of the disclosure.

FIG. 11 is an example flow chart illustrating a method of searching for a generated reference value that approximately equals a voltage across a load that may be used, at least in part, to identify a load according to one embodiment of the disclosure. A method 1100 may begin at block 1102 with digital circuitry causing the application of a periodic signal, such as an alternating current (AC) signal, to a load. For example, digital circuitry 370 may control the first digital-to-analog converter (DAC) 312 to apply a periodic signal to the load 360 of FIG. 3A. At block 1104, digital circuitry may generate a control signal to cause the generation of a reference value by a reference generator. For example, digital circuitry 370 may control the second digital-to-analog converter (DAC) 332 to operate the reference generator 338 of FIG. 3A.

With the digital-to-analog converters set, values throughout the circuit may be determined. At block 1106, an input value, such as voltage value $V_{IN}$ across the load, may be determined in response to the applied periodic signal of block 1102. For example, sense circuitry 320 may measure a voltage across the load 360 of FIG. 3A to determine the voltage value $V_{IN}$. Although a voltage determination is described, a current determination may also be used to execute a similar search algorithm. Next, at block 1108, the generated reference value may be determined, such as by sampling a voltage across the reference generator. For example, the analog-to-digital converter (ADC) 350 may receive a reference voltage $V_{REF}$ from the reference generator 338 of FIG. 3A.

Next, actions for continuing or terminating the search algorithm may be executed based on the measured input value, such as $V_{IN}$, and the measured reference value, such as $V_{REF}$. The determined values of block 1106 (e.g., $V_{IN}$) and 1108 (e.g., $V_{REF}$) may be compared at block 1110 and a determination made whether the input value is close enough to the reference value to obtain a desired level of accuracy regarding a characteristic of the load. For example, block 1110 may be performed by determining whether the $V_{IN}$ value and $V_{REF}$ value are within 10 mV of each other. This determination may be performed by the analog-to-digital converter (ADC) 350 and a termination indicator signal generated and transmitted to the digital circuitry 370. In one embodiment, the analog-to-digital converter (ADC) 350 may perform the determination using one or more comparators. The analog-to-digital converter (ADC) 350 may also include a comparator that determines when the reference value (e.g., $V_{REF}$ signal) crosses the input value (e.g., $V_{IN}$ signal) and generates a comparator trip indicator signal that may be supplied to the digital circuitry 370.

Figure 12:
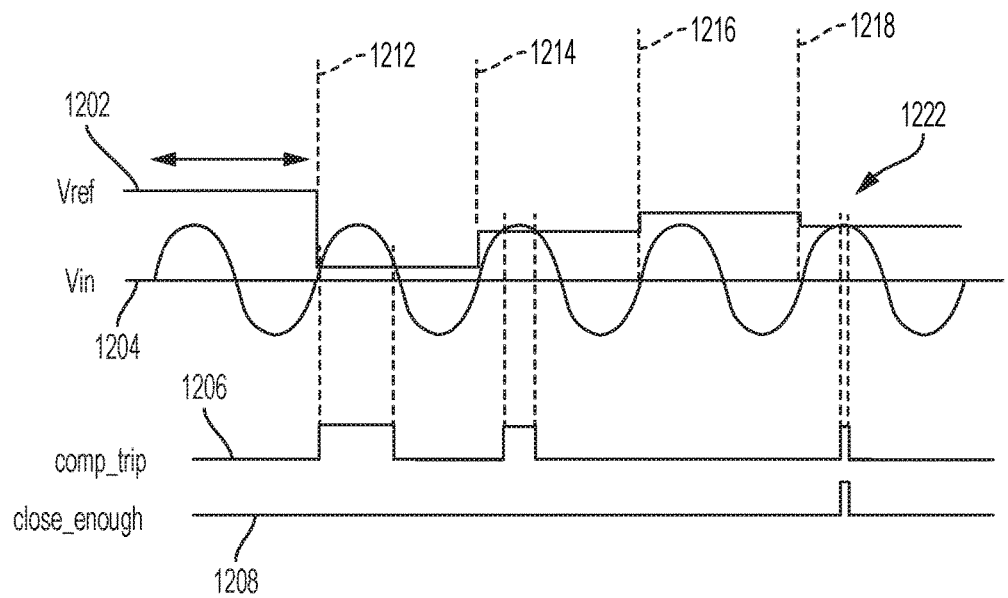
FIG. 12 is an example graph illustrating searching for a generated reference value with a binary search algorithm that approximately equals a voltage across a load that may be used, at least in part, to identify a load according to one embodiment of the disclosure.
Figure 13:
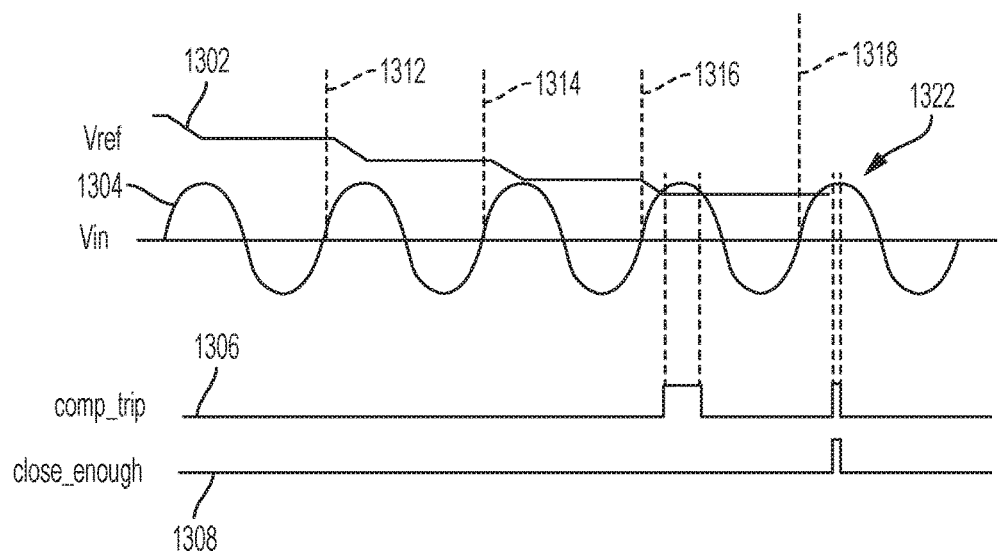
FIG. 13 is an example graph illustrating searching for a generated reference value with a step ramp search algorithm that approximately equals a voltage across a load that may be used, at least in part, to identify a load according to one embodiment of the disclosure.

The digital circuitry 370 may use the comparator trip indicator signal and the termination indicator signal to control the search algorithm and determine when to terminate the search algorithm. For example, if the termination indicator signal is not asserted, then the method 1100 may continue to block 1112 from block 1110. At block 1112, the control signal for generating the reference value may be adjusted in accordance with a search algorithm based on feedback from the comparator trip indicator signal. The control signal may be adjusted to execute, for example, a binary search algorithm, such as shown in FIG. 12, a step ramp search algorithm, such as shown in FIG. 13, or another search algorithm. With the control signal adjusted, the method 1100 may repeat the steps of applying the control signal at block 1104, determining the $V_{IN}$ value at block 1106, and determining the $V_{REF}$ value at block 1108, and again determining whether to terminate the search algorithm at block 1110. In some embodiments, the method 1100 may also repeat block 1102 with blocks 1104, 1106, and 1108. When the digital circuitry determines the termination indicator signal is asserted, then the method 1100 may continue from block 1110 to 1114 to end the search algorithm. A characteristic of the load, such as an impedance of the load, may be determined from the current state of the control signal and/or the last generated reference value that was based on the control signal.

FIG. 12 is an example graph illustrating searching for a generated reference value with a binary search algorithm that approximately equals a voltage across a load that may be used, at least in part, to identify a load according to one embodiment of the disclosure. The graph of FIG. 12 includes a line 1202 representing the $V_{REF}$ signal determined from the reference generator, a line 1204 representing the $V_{IN}$ signal determined from the load, a line 1206 representing a comparator trip indicator signal, and a line 1208 representing a termination indicator signal. The lines 1202, 1204, 1206, and 1208 illustrate application of one embodiment of the method of FIG. 11 executing a binary search algorithm. Times 1212, 1214, 1216, and 1218 indicate beginnings of cycles of the periodic signal applied to the load to generate the $V_{IN}$ signal. At time 1212, the digital circuitry determines no comparator trip signal of line 1206 was asserted during the last cycle and decreases the $V_{REF}$ signal according to a binary search algorithm. At time 1214, the digital circuitry determines the comparator trip signal of line 1206 was asserted during the last cycle and increases the $V_{REF}$ signal according to a binary search algorithm. At time 1216, the digital circuitry determines the comparator trip signal of line 1206 was asserted during the last cycle and increases the $V_{REF}$ signal according to a binary search algorithm. At time 1218, the digital circuitry determines the comparator trip signal of line 1206 was asserted during the last cycle and decreases the $V_{REF}$ signal according to a binary search algorithm. At time 1222, the digital circuitry determines the termination indicator signal of line 1208 was asserted and terminates the search algorithm. The final value of $V_{REF}$ at time 1222 at or near the time the termination indicator signal of line 1208 was asserted may be used to determine a characteristic, such as impedance, of the load.

FIG. 13 is an example graph illustrating searching for a generated reference value with a step ramp search algorithm that approximately equals a voltage across a load that may be used, at least in part, to identify a load according to one embodiment of the disclosure. The graph of FIG. 13 includes a line 1302 representing the $V_{REF}$ signal determined from the reference generator, a line 1304 representing the $V_{IN}$ signal determined from the load, a line 1306 representing a comparator trip indicator signal, and a line 1308 representing a termination indicator signal. The lines 1302, 1304, 1306, and 1308 illustrate application of one embodiment of the method of FIG. 11 executing a step ramp search algorithm. Times 1312, 1314, 1316, and 1318 indicate beginnings of cycles of the periodic signal applied to the load to generate the $V_{IN}$ signal. At time 1312, the digital circuitry determines no comparator trip signal of line 1306 was not asserted during the last cycle and decreases the $V_{REF}$ signal according to a step ramp search algorithm. At time 1314, the digital circuitry determines no comparator trip signal of line 1306 was not asserted during the last cycle and decreases the $V_{REF}$ signal according to a step ramp search algorithm. At time 1316, the digital circuitry determines no comparator trip signal of line 1306 was not asserted during the last cycle and decreases the $V_{REF}$ signal according to a step ramp search algorithm. At time 1318, the digital circuitry determines a comparator trip signal of line 1306 was asserted during the last cycle and increases the $V_{REF}$ signal according to a step ramp search algorithm. At time 1322, the digital circuitry determines the termination indicator signal of line 1308 was asserted and terminates the search algorithm. The final value of $V_{REF}$ at time 1322 at or near the time the termination indicator signal of line 1308 was asserted may be used to determine a characteristic, such as impedance, of the load.

Figure 14:
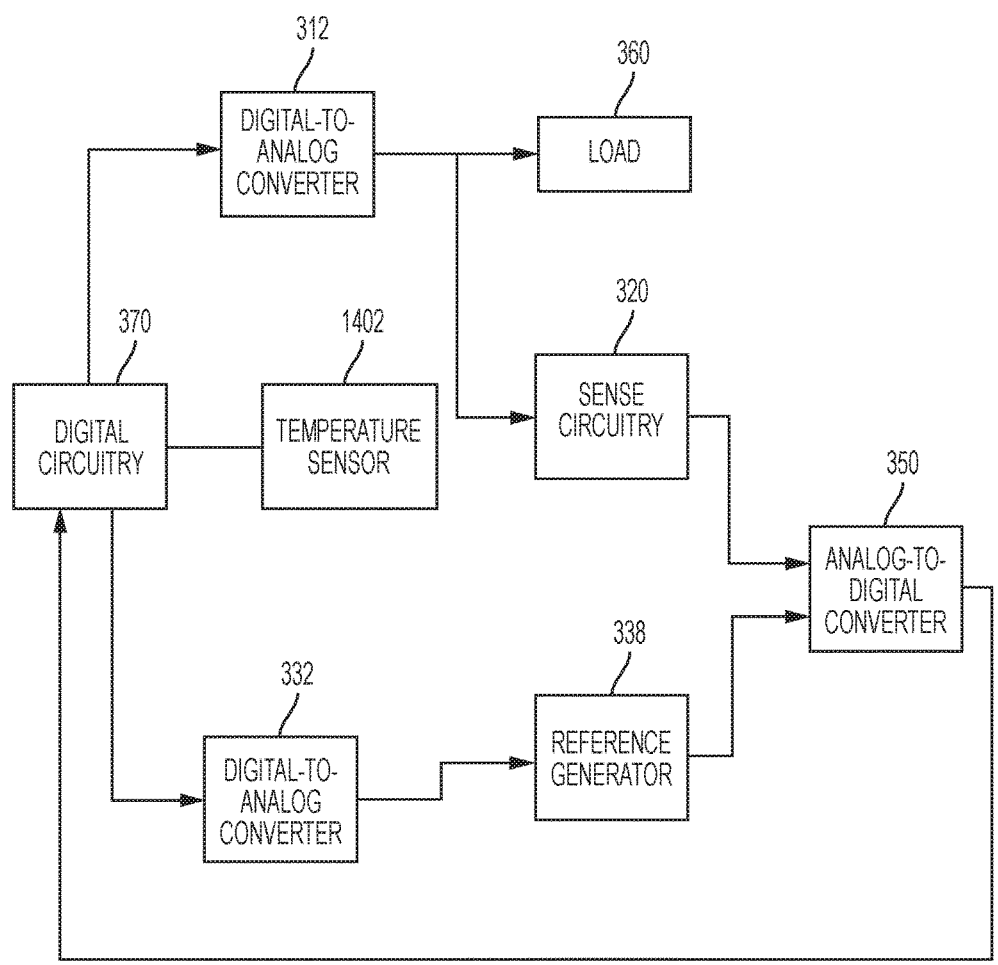
FIG. 14 is an example block diagram illustrating an apparatus for identifying a load according to one embodiment of the disclosure.

In some embodiments, temperature correction may be applied to improve the accuracy and/or precision of load identification. Load identification in some embodiments described above may be performed based on impedance of the load. The impedance of the load may change based on conditions, such as temperature. When the temperature increases, the impedance of the load may also increase. Thus, a load may be incorrectly identified when measurements are being performed on a load at a temperature different than the temperature used to measure a reference load. In some embodiments, a temperature sensor may be integrated with or coupled to a controller or mobile device, and measurements from the temperature sensor used by the controller or mobile device to improve load detection. FIG. 14 is an example block diagram illustrating an apparatus for identifying a load according to one embodiment of the disclosure. A temperature sensor 1402 may be coupled to the digital circuitry 370. The temperature sensor 1402 may include, for example, a bandgap sensor, a diode-based sensor, thermocouple, a thermistor, or any other device that measures temperature or that has a characteristic that varies with temperature. The temperature sensor 1402 may measure an ambient temperature, a junction temperature, a die temperature, or any temperature that may affect the impedance of the load.

In one embodiment, the temperature sensor 1402 may output, to the digital circuitry 370, a signal indicative of a temperature. The digital circuitry 370 may sample or monitor the signal form the temperature sensor 1402 to obtain a measurement of the temperature. The measured temperature may be used by the digital circuitry 370 in identifying the load by adjusting a measured impedance of the load to account for temperature differences. For example, the digital circuitry 370 may be configured to adjust all measured impedances to a predetermined reference temperature, in which that predetermined temperature is the temperature used for measuring reference loads. Thus, changes in temperature in one region where a user attaches a load to the device to another region where a user attaches the same load to a different device will have little or no effect on the accuracy and/or precision of identifying the load (e.g., headphones) attached to the device.

In another embodiment, the temperature sensor 1402 may have some computation capability, such that the temperature sensor 1402 outputs a signal indicating a scaling factor that may be used by the digital circuitry 370 to adjust measured impedances of the load. That is, circuitry for decoding or converting an output of a temperature sensor may be integrated with the sensor, such that the output of the sensor is a value corresponding to an adjustment factor for a calculated impedance, rather than a temperature value. For example, the sensor 1402 may include a plurality of comparators and other circuitry, such as described below with reference to FIG. 17.

Figure 15:
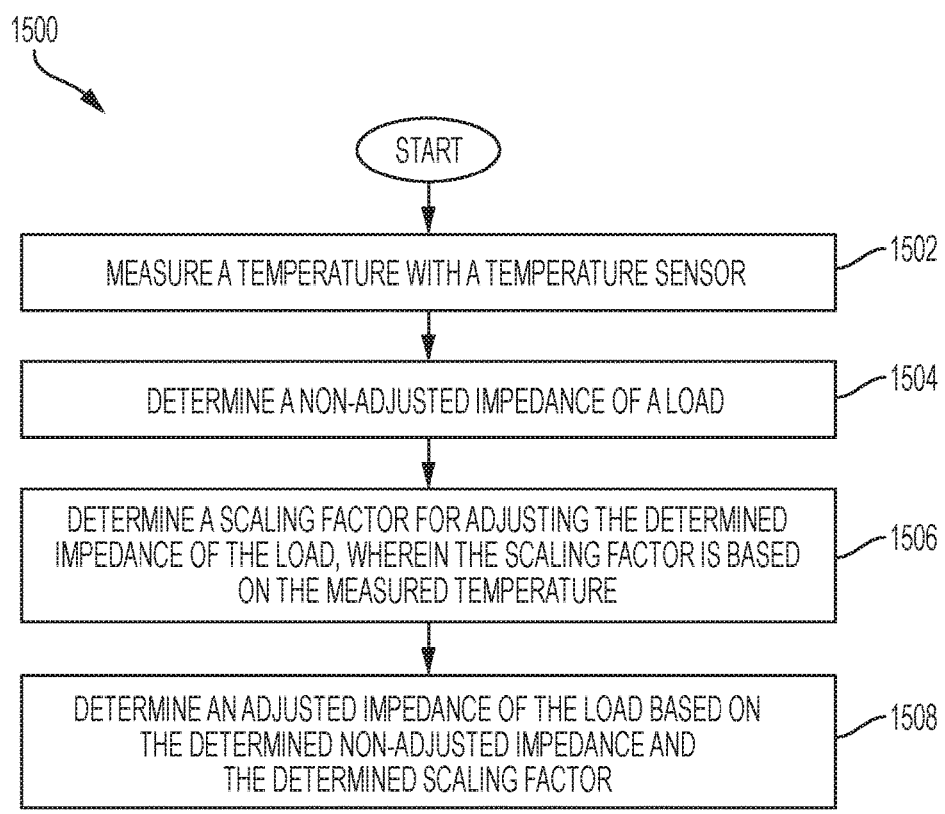
FIG. 15 is an example flow chart illustrating a method of adjusting a determined load impedance based on temperature sensing according to one embodiment of the disclosure.

One example of an algorithm for obtaining an adjusted impedance of the load is shown in FIG. 15. FIG. 15 is an example flow chart illustrating a method of adjusting a determined load impedance based on temperature sensing according to one embodiment of the disclosure. A method 1500 may begin at block 1502 with measuring a temperature with a temperature sensor, such as sensor 1402 of FIG. 14. Then, at block 1504, a non-adjusted impedance of a load may be determined. Block 1504 may include execution of, for example, the methods illustrated in FIG. 2B, FIG. 4, FIG. 5, FIG. 6, FIG. 7, FIG. 8, or other embodiments described herein. Next, at block 1506, a scaling factor may be determined from the measured temperature of block 1502. The scaling factor may be used to adjust the determined non-adjusted impedance of block 1504 to account for temperature changes. In some embodiments, the scaling factor may be determined according to a formula based on the temperature. For example, a linear formula may increase the scaling factor proportional to the temperature, wherein the scaling factor ranges from 0.95 to 1.05. In another embodiment, the scaling factor may be determined from a look-up table. Then, at block 1508, an adjusted impedance may be determined for the load based on the determined non-adjusted impedance and the determined scaling factor. In some embodiments, the calculation of block 1508 may be a multiplication of the determined non-adjusted impedance of block 1504 with the determined scaling factor of block 1506. The calculated adjusted impedance of the load of block 1508 may be used to identify the load, such as by comparing the calculated adjusted impedance to a look-up table of reference values.

Figure 16:
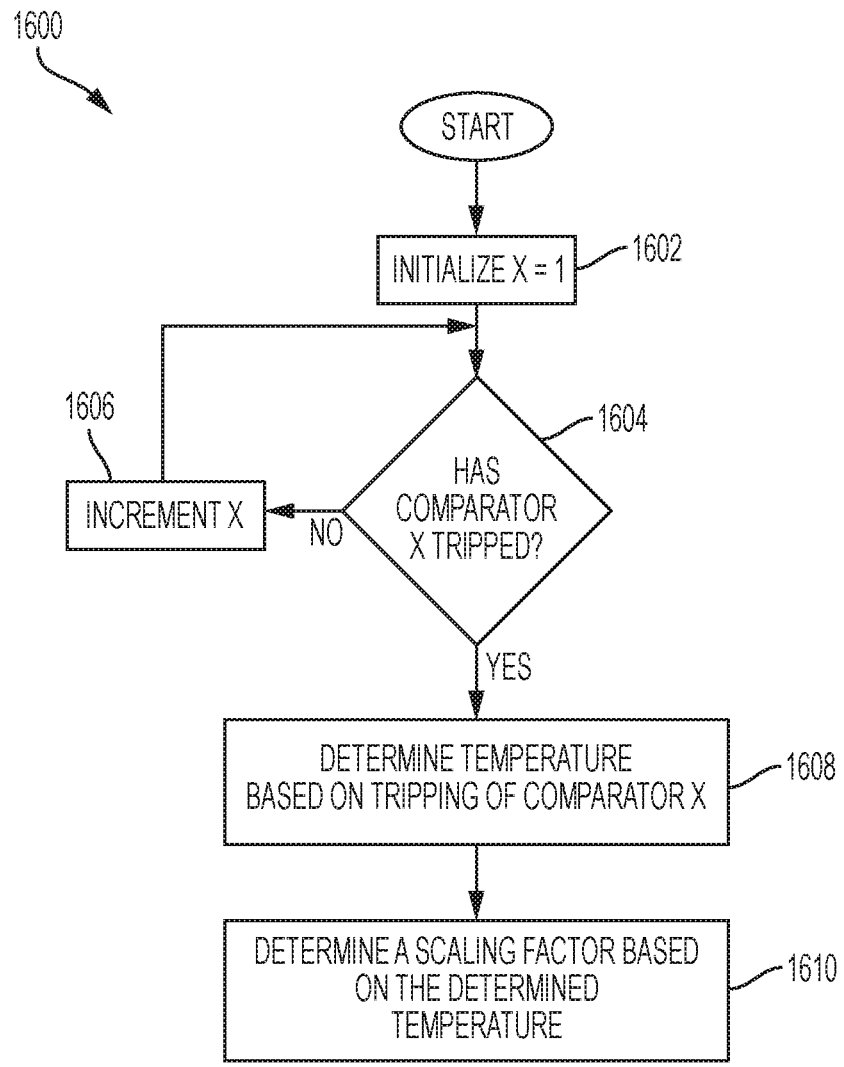
FIG. 16 is an example flow chart illustrating a method of determining a temperature correction factor for adjusting a determined load impedance according to one embodiment of the disclosure.

The temperature may be determined without a full analog-to-digital converter (ADC) by using an array of comparators as described with reference to FIG. 16 and FIG. 17. The array of comparators may be used to determine when the temperature crosses thresholds assigned to each of the comparators. For example, each comparator may correspond to a different ten-degree increment between −30 degrees and 130 degrees. The outputs of the array of comparators may be used to approximate the temperature to within the ten-degree range between the tripped and non-tripped comparator. FIG. 16 is an example flow chart illustrating a method of determining a temperature correction factor for adjusting a determined load impedance according to one embodiment of the disclosure. A method 1600 may begin at block 1602 with initializing a variable x to 1. Then, at block 1604, it is determined whether comparator x has tripped, such as by determining if the output from comparator x is high. If not, then the method 1600 continues to block 1606 to increment the variable x and repeat blocks 1602 and 1604. When a comparator x is detected as tripped at block 1604, then the method 1600 may use the value of x to determine the temperature at block 1608. The determined temperature of block 1608 may be used to determine a scaling factor at block 1610, and that scaling factor used to adjust a determined impedance of the load and improve load identification. The method of FIG. 17 may be implemented in digital circuitry 370, the temperature sensor 1402, or another controller.

Figure 17:
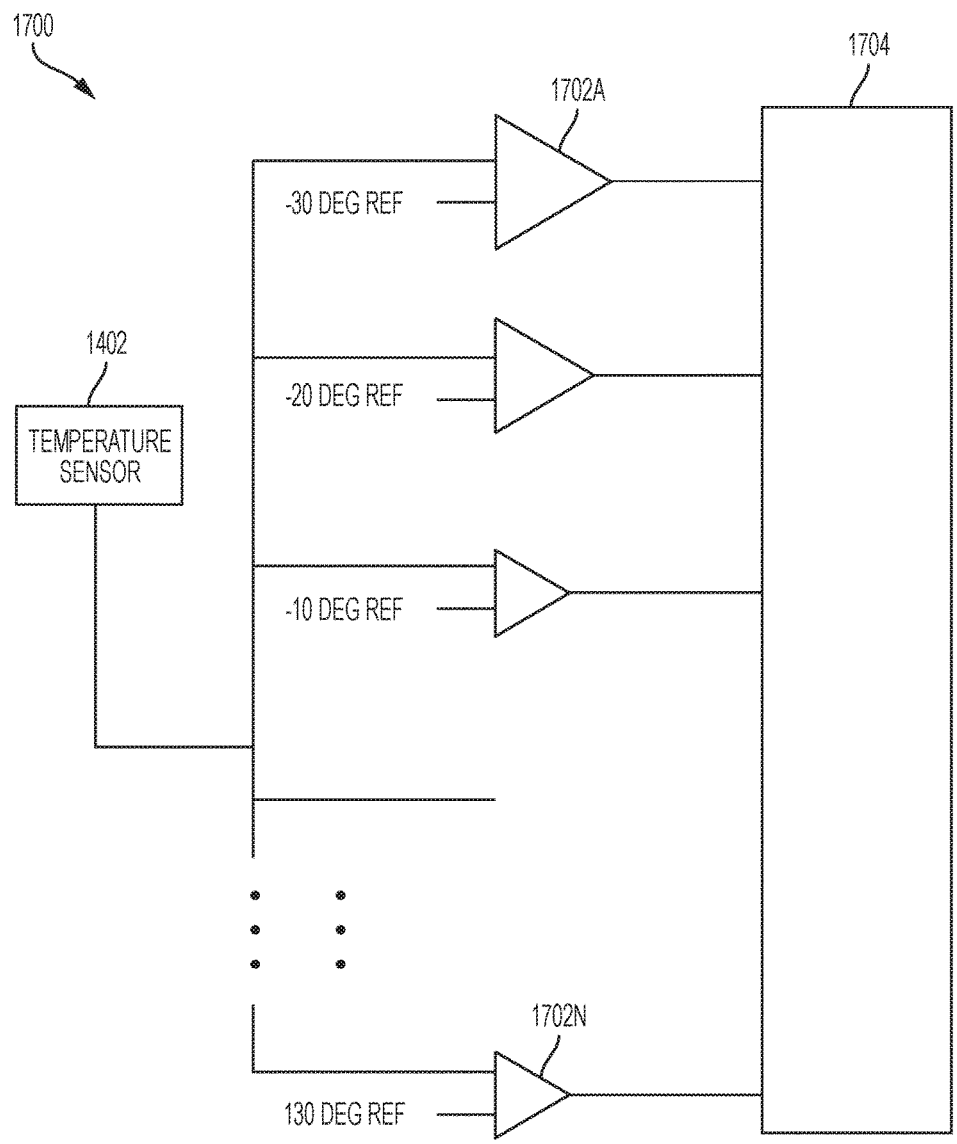
FIG. 17 is an example circuit illustrating detection of a temperature using a temperature sensor according to one embodiment of the disclosure.

FIG. 17 is an example circuit illustrating detection of a temperature using a temperature sensor according to one embodiment of the disclosure. A circuit 1700 includes the temperature sensor 1402 coupled to a plurality of comparators 1702A-N. Each of the comparators 1702A-N may also be coupled to a reference value for different temperatures. The comparators 1702A-N may "trip," or change output from zero to one or one to zero, when the input from temperature sensor 1402 crosses the reference input for a respective comparator 1702A-N. The outputs of the comparators 1702A-N may be coupled to digital circuitry 1704, which may be coupled to or integrated with digital circuitry 370 of FIG. 14. The circuitry 1704 may decode the output of the comparators 1702A-N to determine the temperature and/or a scaling factor. Although the embodiments of FIG. 16 and FIG. 17 above describe a temperature determination to within ten degrees of a range from −30 to 130 degrees, a different number of comparators or different configuration of reference values may be used to obtain different accuracies of measured temperature, and the circuitry 1704 configured to properly decode the outputs. Further, other embodiments may implement different techniques for measuring the temperature using the temperature sensor 1402. For example, a full analog-to-digital converter (ADC) may be included to convert an analog output of the temperature sensor 1402 to a digital value representing the temperature.

According to certain aspects of the invention and disclosed embodiments of the invention described above, an electronic device may be configured to identify a load coupled to the device. The device may measure direct current (DC) and/or alternating current (AC) characteristics of the load to identify the load. The device may then take action based on the identification of the load. For example, a specific transducer may be identified as coupled to the electronic device and an appropriate equalization curve applied to an audio output of the device. The measurement of characteristics of the load may include controlling a reference generator according to a search algorithm, such as a step ramp or binary search, to identify the load. An analog-to-digital converter (ADC) may operate through the search algorithm to provide feedback to digital circuitry regarding how to proceed through the search algorithm to identify the load.

The schematic flow chart diagrams of FIG. 2B, FIG. 4, FIG. 5, FIG. 6, FIG. 7, FIG. 8, FIG. 11, FIG. 15, and FIG. 16 are generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although analog-to-digital converters (ADCs) are described throughout the detailed description, aspects of the invention may be applied to the design of other converters, such as digital-to-analog converters (DACs) and digital-to-digital converters, or other circuitry and components based on delta-sigma modulation. Further, although ones (1s) and zeros (0s) or highs and lows are given as example bit values throughout the description, the function of ones and zeros may be reversed without change in operation of the processor described in embodiments above. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
a first output node configured to couple to a load;
a first digital-to-analog converter (DAC) coupled to the first output node;
sense circuitry coupled to the first output node;
a reference generator;
a second digital-to-analog converter (DAC) coupled to the reference generator;
an analog-to-digital converter (ADC) coupled to the sense circuitry and coupled to the reference generator;
a temperature sensor configured to measure a temperature; and
digital circuitry coupled to the first digital-to-analog converter (DAC) and coupled to the second digital-to-analog converter (DAC) and coupled to the analog-to-digital converter (ADC) and configured to control at least one of the first digital-to-analog converter (DAC) and the second digital-to-analog converter (DAC) to determine an impedance of the load based, at least in part, on the measured temperature and an output of the analog-to-digital converter (ADC).

2. The apparatus of claim 1, wherein the digital circuitry is configured to identify the load based on the determined impedance of the load.

3. The apparatus of claim 1, wherein the digital circuitry is configured to:
determine a non-adjusted impedance of the load based, at least in part, on the output of the analog-to-digital converter (ADC);
determine a scaling factor based, at least in part, on the measured temperature; and
determine the impedance of the load based, at least in part, on the non-adjusted impedance of the load and the scaling factor.

4. The apparatus of claim 3, wherein the digital circuitry is configured to identify the load based on the determined impedance of the load, wherein the scaling factor adjusts the determined non-adjusted impedance to an impedance at a reference temperature, and wherein the digital circuitry is configured to identify the load by comparing the determined impedance with a set of previously-measured impedances for various loads that were measured at approximately the reference temperature.

5. The apparatus of claim 1, further comprising a plurality of comparators coupled to the temperature sensor, wherein the plurality of comparators is further coupled to a plurality of reference signals corresponding to a plurality of temperatures, wherein the digital circuitry is configured to determine the measured temperature based, at least in part, on outputs of the plurality of comparators.

6. The apparatus of claim 1, wherein the digital circuitry is configured to control at least one of the first digital-to-analog converter (DAC) and the second digital-to-analog converter (DAC) based on a search algorithm to identify the load.

7. The apparatus of claim 1, wherein the digital circuitry is configured:
to operate the first digital-to-analog (DAC) to generate a direct current (DC) signal at the first output node, wherein the analog-to-digital converter (ADC) is configured to generate an output digital signal based, at least in part, on a sensed value measured by the sense circuitry;
to operate the second digital-to-analog (DAC) to generate, by the reference generator, a reference input for the analog-to-digital converter (ADC), wherein the analog-to-digital converter (ADC) is configured to generate the output digital signal based, at least in part, on the reference input; and
to monitor an output of the analog-to-digital converter (ADC) to determine a DC impedance of the load.

8. An apparatus, comprising:
digital circuitry configured to determine an impedance of a load, wherein the digital circuitry is configured to perform the steps of:
applying a first signal to a load using a first digital-to-analog converter (DAC);
determining a characteristic of the load based on the applied first signal;
applying a second signal to a reference generator using a second digital-to-analog converter (DAC);
determining a characteristic of the reference generator in response to the applied second signal;
comparing the determined characteristic of the load and the determined characteristic of the reference generator;
receiving a measured temperature; and
determining the impedance of the load based, at least in part, on the received temperature and on the comparing of the determined characteristic of the load and the determined characteristic of the reference generator.

9. The apparatus of claim 8, further comprising the step of adjusting at least one of the first signal and the second signal based on the comparing of the determined characteristic of the load and the determined characteristic of the reference generator, wherein the step of determining the impedance of the load is based on the adjusting of the at least one of the first signal and the second signal.

10. The apparatus of claim 8, wherein the digital circuitry is configured to:
determine a non-adjusted impedance of the load;
determine a scaling factor based, at least in part, on the measured temperature; and
determine the impedance of the load based, at least in part, on the non-adjusted impedance of the load and the scaling factor.

11. The apparatus of claim 10, wherein the impedance of the load is an impedance adjusted to a reference temperature, wherein the digital circuitry is further configured to identify the load by comparing the determined impedance with a set of previously-measured impedances for various loads that were measured at approximately the reference temperature.

12. The apparatus of claim 8, wherein the digital circuitry is configured to monitor a plurality of comparators coupled to a temperature sensor, wherein the plurality of comparators is further coupled to a plurality of reference signals corresponding to a plurality of temperatures, and wherein the digital circuitry is configured to receive the measured temperature based, at least in part, on outputs of the plurality of comparators.

13. The apparatus of claim 8, wherein the digital circuitry is further configured to perform steps comprising adjusting the second signal applied from the second digital-to-analog converter (DAC) to the reference load, wherein the adjustment comprises part of a search algorithm to identify the load.

14. A method, comprising:
applying a first signal to a load using a first digital-to-analog converter (DAC);
determining a characteristic of the load based on the applied first signal;
applying a second signal to a reference generator using a second digital-to-analog converter (DAC);
determining a characteristic of the reference generator in response to the applied second signal;
comparing the determined characteristic of the load and the determined characteristic of the reference generator;
receiving a temperature measurement; and
determining an impedance of the load based, at least in part, on the compared characteristic of the load and the characteristic of the reference generator and on the received temperature.

15. The method of claim 14, further comprising the step of adjusting at least one of the first signal and the second signal based on the comparing of the determined characteristic of the load and the determined characteristic of the reference generator, wherein the step of determining the impedance of the load is based on the adjusting of the at least one of the first signal and the second signal.

16. The method of claim 14, further comprising adjusting the second signal applied from a second digital-to-analog converter (DAC) to the reference load, wherein the adjusting comprises part of a search algorithm to identify the load.

17. The method of claim 14, further comprising:
determining a non-adjusted impedance of the load;
determining a scaling factor based, at least in part, on the measured temperature; and
determining the impedance of the load based, at least in part, on the non-adjusted impedance of the load and the scaling factor.

18. The method of claim 17, wherein the step of determining the impedance comprises adjusting the impedance to a reference temperature, and wherein the method further comprises identifying the load by comparing the determined impedance with a set of previously-measured impedances for various loads that were measured at approximately the reference temperature.

19. The method of claim 14, further comprising monitoring a plurality of comparators coupled to a temperature sensor, wherein the plurality of comparators is further coupled to a plurality of reference signals corresponding to a plurality of temperatures, and wherein the step of receiving the measured temperature is based, at least in part, on outputs of the plurality of comparators.

* * * * *